US007778812B2

(12) United States Patent
Hoffman, Jr.

(10) Patent No.: US 7,778,812 B2
(45) Date of Patent: Aug. 17, 2010

(54) SELECTING DATA TO VERIFY IN HARDWARE DEVICE MODEL SIMULATION TEST GENERATION

(75) Inventor: Robert Hoffman, Jr., East Bethel, MN (US)

(73) Assignee: Micron Technology, Inc., Boise, ID (US)

( * ) Notice: Subject to any disclaimer, the term of this patent is extended or adjusted under 35 U.S.C. 154(b) by 1110 days.

(21) Appl. No.: 11/031,290

(22) Filed: Jan. 7, 2005

(65) Prior Publication Data

US 2006/0156269 A1   Jul. 13, 2006

(51) Int. Cl.
*G06F 17/50* (2006.01)
(52) U.S. Cl. .............................. 703/14; 703/15; 703/16; 703/17; 703/20; 702/108; 702/109; 702/117; 702/119; 702/120; 711/157; 711/137; 711/206
(58) Field of Classification Search ..................... 707/3; 711/122, 170, 3, 207, 108; 703/13, 22, 14; 702/119; 709/225; 324/765
See application file for complete search history.

(56) References Cited

U.S. PATENT DOCUMENTS

| 3,798,613 | A | * | 3/1974 | Edstrom et al. ............... 710/14 |
| 5,244,534 | A | | 9/1993 | Yu et al. |
| 5,338,700 | A | | 8/1994 | Dennison et al. |
| 5,387,550 | A | | 2/1995 | Cheffings et al. |
| 5,423,019 | A | * | 6/1995 | Lin ............................. 711/135 |
| 5,448,577 | A | * | 9/1995 | Wells et al. .................. 714/767 |
| 5,451,546 | A | | 9/1995 | Grubisich et al. |
| 5,488,011 | A | | 1/1996 | Figura et al. |
| 5,519,237 | A | | 5/1996 | Itoh et al. |
| 5,542,058 | A | * | 7/1996 | Brown et al. ................. 713/502 |
| 5,553,258 | A | * | 9/1996 | Godiwala et al. .............. 711/3 |
| 5,569,948 | A | | 10/1996 | Kim |
| 5,580,821 | A | | 12/1996 | Mathews et al. |
| 5,588,111 | A | * | 12/1996 | Cutts et al. ..................... 714/9 |
| 5,600,579 | A | * | 2/1997 | Steinmetz, Jr. ............... 703/13 |

(Continued)

FOREIGN PATENT DOCUMENTS

DE          4445796          12/1993

(Continued)

OTHER PUBLICATIONS

Mullins, C. S, , *Chapter 5 Application Design, Section "Locking"*, Database Administration: The Complete Guide to practices and Procedures, (Jun. 14, 2002), 8 pgs.

(Continued)

*Primary Examiner*—Kamini S Shah
*Assistant Examiner*—Cuong V Luu
(74) *Attorney, Agent, or Firm*—Schwegman, Lundberg & Woessner, P.A.

(57) ABSTRACT

Embodiments of the present invention provide a method for generating write and read commands used to test hardware device models. The method is able to generate multiple write commands to a location without having to generate intervening read commands to validate the data. In addition, the method enables read commands to be generated in a different sequence from the sequence of generated write commands, having different sizes than the sizes of the write commands, and that maximize the amount of data read (verified) and minimize the amount of unnecessary reads (re-verification).

63 Claims, 10 Drawing Sheets

U.S. PATENT DOCUMENTS

| | | | |
|---|---|---|---|
| 5,658,829 A | 8/1997 | Mathews et al. | |
| 5,669,000 A | 9/1997 | Jessen et al. | |
| 5,710,073 A | 1/1998 | Jeng et al. | |
| 5,726,918 A * | 3/1998 | Giramma et al. | 703/14 |
| 5,758,113 A * | 5/1998 | Peet et al. | 712/203 |
| 5,758,188 A * | 5/1998 | Appelbaum et al. | 710/35 |
| 5,768,567 A * | 6/1998 | Klein et al. | 703/13 |
| 5,776,815 A | 7/1998 | Pan et al. | |
| 5,777,942 A * | 7/1998 | Dosaka et al. | 365/230.03 |
| 5,780,339 A | 7/1998 | Liu et al. | |
| 5,792,687 A | 8/1998 | Jeng et al. | |
| 5,809,320 A * | 9/1998 | Jain et al. | 712/34 |
| 5,817,573 A | 10/1998 | Rhodes et al. | |
| 5,825,059 A | 10/1998 | Kuroda | |
| 5,832,418 A | 11/1998 | Meyer | |
| 5,841,967 A | 11/1998 | Sample et al. | |
| 5,858,865 A | 1/1999 | Juengling et al. | |
| 5,866,927 A | 2/1999 | Cho et al. | |
| 5,872,048 A | 2/1999 | Reinberg | |
| 5,872,909 A | 2/1999 | Wilner et al. | |
| 5,956,594 A | 9/1999 | Yang et al. | |
| 5,956,741 A * | 9/1999 | Jones | 711/1 |
| 5,966,306 A * | 10/1999 | Nodine et al. | 700/121 |
| 6,006,166 A * | 12/1999 | Meyer | 702/119 |
| 6,058,492 A | 5/2000 | Sample et al. | |
| 6,066,552 A | 5/2000 | Figura | |
| 6,076,180 A | 6/2000 | Meyer | |
| 6,117,725 A | 9/2000 | Huang | |
| 6,127,260 A | 10/2000 | Huang | |
| 6,131,079 A * | 10/2000 | Smith | 703/13 |
| 6,170,078 B1 * | 1/2001 | Erle et al. | 716/4 |
| 6,182,258 B1 | 1/2001 | Hollander | |
| 6,188,975 B1 | 2/2001 | Gay | |
| 6,321,289 B1 | 11/2001 | Engfer et al. | |
| 6,323,557 B1 | 11/2001 | Figura | |
| 6,336,176 B1 | 1/2002 | Leyda | |
| 6,401,151 B1 | 6/2002 | Hoffman | |
| 6,425,048 B1 | 7/2002 | Kaganoi | |
| 6,446,164 B1 * | 9/2002 | Nguyen et al. | 711/118 |
| 6,446,188 B1 | 9/2002 | Henderson | |
| 6,477,634 B1 | 11/2002 | Comment | |
| 6,490,671 B1 | 12/2002 | Frank et al. | |
| 6,516,383 B1 | 2/2003 | Patra et al. | |
| 6,529,999 B1 | 3/2003 | Keller et al. | |
| 6,571,204 B1 * | 5/2003 | Meyer | 703/22 |
| 6,678,875 B2 * | 1/2004 | Pajak et al. | 716/11 |
| 6,687,786 B1 | 2/2004 | Wong et al. | |
| 6,707,693 B1 * | 3/2004 | Ichiriu | 365/49.17 |
| 6,725,326 B1 | 4/2004 | Patra et al. | |
| 6,812,726 B1 * | 11/2004 | Ong | 324/765 |
| 6,912,672 B2 | 6/2005 | Ko et al. | |
| 6,944,039 B1 * | 9/2005 | Nataraj et al. | 365/49.17 |
| 6,957,299 B2 * | 10/2005 | Villaret et al. | 711/108 |
| 6,970,816 B1 | 11/2005 | Bryan et al. | |
| 6,971,109 B1 | 11/2005 | Williams et al. | |
| 7,000,224 B1 | 2/2006 | Osborne, II et al. | |
| 7,016,997 B2 | 3/2006 | Wu | |
| 7,017,089 B1 * | 3/2006 | Huse | 714/718 |
| 7,019,998 B2 * | 3/2006 | Tran et al. | 365/49.1 |
| 7,343,477 B1 * | 3/2008 | Thatipelli et al. | 712/218 |
| 2001/0040827 A1 * | 11/2001 | Dosaka et al. | 365/189.01 |
| 2003/0101307 A1 * | 5/2003 | Gemelli et al. | 710/305 |
| 2003/0182498 A1 * | 9/2003 | Villaret et al. | 711/108 |
| 2003/0196066 A1 * | 10/2003 | Mathews | 711/207 |
| 2003/0200049 A1 * | 10/2003 | Sutton | 702/120 |
| 2004/0044508 A1 * | 3/2004 | Hoffman, Jr. | 703/13 |
| 2004/0199786 A1 * | 10/2004 | Walmsley et al. | 713/200 |
| 2004/0213027 A1 * | 10/2004 | Liu et al. | 365/49 |
| 2005/0086417 A1 | 4/2005 | Meyer et al. | |
| 2005/0108495 A1 * | 5/2005 | McKenney et al. | 711/170 |
| 2005/0177633 A1 * | 8/2005 | Plunkett | 709/225 |
| 2005/0182985 A1 * | 8/2005 | Shipton et al. | 713/340 |
| 2005/0204058 A1 * | 9/2005 | Philbrick et al. | 709/238 |
| 2006/0187251 A1 * | 8/2006 | Pulver et al. | 347/13 |
| 2006/0271347 A1 | 11/2006 | Hoffman, Jr. | |
| 2006/0274112 A1 * | 12/2006 | Pulver et al. | 347/42 |
| 2006/0294312 A1 * | 12/2006 | Walmsley | 711/122 |
| 2007/0019016 A1 * | 1/2007 | Silverbrook et al. | 347/13 |
| 2007/0083491 A1 * | 4/2007 | Walmsley et al. | 707/3 |

FOREIGN PATENT DOCUMENTS

| | | |
|---|---|---|
| JP | 07-142597 | 6/1995 |
| JP | 08-070106 | 3/1996 |
| KR | 1997-7830 | 5/1997 |

OTHER PUBLICATIONS

Saunders, et al., "Testbench Tutorial, Part 2", *Integrated System Design*, http://www.eetimes.com/editorial/1995/hdlcolumn9505.html, (1996), 7 pgs.

* cited by examiner

SELECTING DATA TO VERIFY IN HARDWARE DEVICE MODEL SIMULATION TEST GENERATION

RELATED APPLICATION

The invention disclosed and claimed herein relates to previously filed U.S. patent application Ser. No. 10/230,870, filed on Aug. 29, 2002, and published on Mar. 4, 2004. U.S. patent application Ser. No. 10/230,870 is hereby incorporated by reference for any purpose.

TECHNICAL FIELD

The present invention relates generally to methods for testing hardware device models, and more particularly, to methods for selecting data to be verified in generated commands, which a simulation program executes to cause a hardware device model to simulate operation in its real-world environment.

BACKGROUND

When a new device for a computer or other electronic system is being developed, a software model of the device (also referred to herein as a "device model," "device under test," or "DUT") is often created in order to test the device's functionality before implementing the device in hardware. The device model is then thoroughly tested to try to identify design problems. This enables device designers to modify the design, if necessary, to increase the likelihood that the device will operate in a consistent and predictable manner.

For example, new designs for memory or system controllers are typically tested using a device model. In order to test such a software model, a "test command generation program" first creates a sequence of read and write commands, and stores these commands in a text file. A device model test program then executes those commands.

At a minimum, a "write" command includes a location (e.g., a memory address) and one or more bits or bytes of data that are to be written to that location. A "read" command is used to verify that data was properly written to a location, and that the data can be accurately retrieved.

In generating each write or read command within a command list, it is common to randomly select the write locations in order to improve the robustness of the test. Therefore, a series of write operations may jump randomly to various locations, rather than sequentially writing to consecutive locations. The location selected for a read command is constrained by the fact that it is necessary for a data location to be written to before it is read from. Otherwise, valid data would not exist at the location.

Table 1, below, is a simplified example of a sequence of write/read commands, which could be generated by a test command generation program and later executed by a device model test program. Each command corresponds to a write to or a read from a single location of a device. Each entry includes the location corresponding to the operation and a byte of data that is to be written or that is expected to exist at the location.

TABLE 1

1.  write (addr => x"4005FAC0", data_value => x"A1")
2.  write (addr => x"001FE600", data_value => x"07")
3.  read  (addr => x"4005FAC0", data_value => x"A1")
4.  write (addr => x"40331A18", data_value => x"00")

TABLE 1-continued 5.  read  (addr => x"001FE600", data_value => x"07")
6.  read  (addr => x"40331A18", data_value => x"00")
7.  write (addr => x"001FF230", data_value => x"FF")
8.  read  (addr => x"001FF230", data_value => x"FF")

The example commands, above, could be used to test a DUT, such as a memory controller, that writes to and reads from a single device (e.g., a dynamic random access memory (DRAM)). In contrast to a simple memory controller, a system controller or other device could write to or read from multiple devices, such as one or more memory devices and/or input/output (I/O) devices, for example. Therefore, write and read commands for system controllers or other devices often include an additional field, not shown in the example commands above, which indicates what device is being written to or read from. In addition, a command could indicate that multiple locations should be written to or read from. For ease of illustration, however, the above commands apply to one-byte data transfers to or from a single, unspecified device.

FIG. 3 illustrates a flowchart of a method for generating a command list in accordance with the prior art. The method for generating the command list begins, in block 302, by initializing an array, which will store a history or transaction trace table. The history table is used to maintain a record of the address and data value for each generated write command, thereby capturing the expected state of a DUT that will execute the instructions. The history table is also used to generate subsequent read commands, as will be explained in more detail below.

To initialize the array, the prior art method allocates a block of memory sufficient to hold a distinct array entry for each write operation that the test ultimately will perform. Therefore, for example, if the user indicated that he or she wanted the test to perform 1000 write operations, then the method would allocate memory to store at least 1000 entries.

Next, in block 304, a write pointer and a read pointer are initialized to a value of 0. The write pointer is used to indicate which entry, within the array, the next location and data value that will correspond to a write command will be stored. The read pointer is used to indicate the entry, in the array, where the method should look to get a location and a data value for the next read command. Because no commands have been created, both pointers are initially set to 0.

Next, in block 306, a command type is chosen. The command type is either a "write" or a "read." The first command is constrained to select a "write" type command, so that valid data will exist within a location before that location is read from.

A determination is then made, in block 308, whether the command is a "write" or a "read." If the command is a "write," then a location within the range of defined locations being tested is randomly chosen, in block 310. In some cases, a write size also can be chosen, which indicates a number of locations of data to write. For ease of illustration, commands for writing and reading only a single location are described in the context of FIG. 3.

A determination is then made, in block 312, whether or not a command to write to that location has been previously generated. This can be done by evaluating the entries previously stored within the array. If so, then an additional determination is made whether a command has been generated to read the data at that location, in block 314. This can be done by determining whether the read pointer points to an array entry that occurs after the array entry that includes the location. If a command to verify (i.e., read) the data has not been generated, then another location is chosen, in block 310, and the method iterates.

If a command to verify the data has been generated (as determined in block 314), or if a command to write to the location was not previously generated (as determined in block 312), then the command parameters (e.g., location, data size, data) are written in the entry of the array that is indicated by the write pointer, in block 316. The write pointer is then incremented, in block 318, to point to the next entry. In block 320, a write command is then generated, by creating a new command in the command list (e.g., Table 1).

Referring back to block 308, if a determination is made that the selected command type is a "read" command, then a determination is made, in block 322, whether or not the write pointer is greater than the read pointer. If not, then a read command cannot be generated, and the procedure returns to block 306 to choose a command type. If so, then the command parameters are retrieved from the array entry at which the read pointer is pointing, in block 324. The read pointer is then incremented, in block 326, and a read command is generated, in block 320, by creating a new command in the command list (e.g., Table 1).

After block 320, a determination is made whether the method is done generating test commands, in block 328. Typically, a user has pre-specified the number of commands that the user wants the program to generate. If the number of pre-specified commands has been generated, then a determination is made that the method is done. Otherwise, the method iterates as shown until the pre-specified number of commands has been generated.

Prior art methods for generating a command list have several limitations. First, since the read pointer sequentially steps through the array entries, each read command must correspond, in exact sequence, to the write commands that were previously generated. Second, if a particular location has already been written to, a second write command to that location cannot be generated until the data previously stored in that location has been verified completely with one or more read commands. Otherwise, the verify phase would see different data from what is expected, and an error would be declared.

Because of these and other limitations discussed elsewhere, the tests run using the prior art methods of command generation are inherently inflexible, and often are not particularly robust or concise. For example, in a more robust test, it may be desirable to write to a location multiple times before the location is read from. In addition, a more robust test should be able to perform reads to various locations in a substantially different order than writes to those locations. Also, it may be desired to read more or fewer locations than were written to in previously generated write commands.

Another disadvantage to prior art methods is that the array used in the command generation process can be extremely large, consuming large amounts of memory and possibly limiting the number of commands that may be generated. This is particularly true in cases where it is desired to write to and verify locations multiple times. For example, if a user wants every address in memory to be written to two or more times, then the array would have to have at least twice as many entries as there are address locations. For tests corresponding to large memory devices, this means that the array could consume large quantities of memory.

Such prior art methods for generating a command list, such as the list illustrated above, have several limitations. First, each read command must correspond, in exact sequence, to write commands that were previously generated. Thus, as illustrated in the example above, the first read command (i.e., command #3) can only read from the location specified in the first write command (i.e., command #1). Similarly, the second read command (i.e., command #5) can only read from the location specified in the second write command (i.e., command #2), and so on. Second, if a particular location has already been written to, a second write command to that location cannot be generated until the data previously stored in that location has been verified with a read command. Otherwise the read command might see different data from what is expected, and an error would be declared.

Because of these and other limitations, the tests run using the prior art methods of command generation are inflexible and often are very long. For example, prior art methods cannot write to a location multiple times before reading from the location. In addition, prior art methods cannot perform reads of various locations in a different order from the order of writes to those locations. Nor can prior art methods perform a read operation that has a size that is different from the size of the corresponding write operation. Instead, a read operation must completely verify a corresponding write operation, using prior art methods, and is unable to "sub-verify" a write operation.

Using prior art methods, all test commands are sequentially included in an array while the commands are being generated. Accordingly, another disadvantage to prior art methods is that the amount of memory used in the command generation process can be extremely large. This is particularly true in cases where it is desired to write to and verify locations multiple times. For example, if a user wants every location to be written to two or more times, then the array would have to include at least twice as many entries as there are locations. For tests corresponding to large address ranges, this means that the array would consume large quantities of memory during the test generation process.

Accordingly, what is needed is a test command generation method that is more flexible and concise. Specifically needed is a test command generation method that allows read commands to be generated in a different sequence from previously generated write commands. Further needed is a test command generation method that allows multiple write commands for a particular location to be generated, regardless of whether a read command to verify the data has been generated. In addition, what is needed is a test command generation method that enables read commands to be more varied and flexible (e.g., allowing read commands that specify different data sizes and different masks than the data sizes and masks specified in previously generated write commands). Moreover, in connection with variable and flexible read commands, a test command generation method is needed that maximizes the amount of data that is newly verified and minimizes the amount of unnecessary reads (re-verification). Also needed is a method that enables more test permutations to be performed for better test coverage, without requiring unreasonably lengthy command lists. Further needed is a test command generation method that requires less overhead (e.g., less memory) to execute.

SUMMARY

Embodiments of the present invention provide a method for generating one or more commands to test a software model of a hardware device. In one embodiment, the method includes choosing a write location that will be included in a write command, where when the write command is later executed, the write command will cause the software model to attempt to write data to the write location, and storing a data value that indicates what data the write command will include. The method further includes updating a data valid indicator to indicate that, after the write command is executed, valid data should exist at the write location, and updating a data verified indicator to indicate that, after the write command is executed, the data at the write location has not yet been verified with a subsequent read command to be the same as the data value. The method further includes generating the write command, which includes the write location and the data value.

In another embodiment, the method includes choosing a write location that will be included in a write command, where when the write command is later executed, the write command will cause the software model to attempt to write data to the write location. The method further includes determining whether a currently-existing node corresponds to a block of locations within which the write location falls, where a node is a data structure that includes an address field that indicates the block of locations to which the node pertains, a data field to store data written within the block of locations, a data valid field, which includes a data valid indicator for each location within the block of locations, and a data verified field, which includes a data verified indicator for each location within the block of locations. If a currently-existing node does not correspond, the method includes creating a new node that corresponds to the block of locations within which the write location falls, storing the data value in a space within the data field of the new node that corresponds to the write location, and updating the data valid indicator and the data verified indicator, within the new node, which correspond to the write location. If a currently-existing node does correspond, the method includes storing the data value in a space within the data field of the currently-existing node that corresponds to the write location, and updating the data valid indicator and the data verified indicator, within the currently-existing node, which correspond to the write location. The method further includes generating the write command, which includes the write location and the data value.

In still another embodiment, the method includes choosing a write location that will be included in a write command, where when the write command is later executed, the write command will cause the software model to attempt to write data to the write location. In addition, the method includes creating a first node, which is a data structure that includes an address field that indicates a block of locations that includes the write location, a data field to store data written within the block of locations, a data valid field, which includes a data valid indicator for each location within the block of locations, and a data verified field, which includes a data verified indicator for each location within the block of locations. Further the method includes storing a data value in a space within the data field of the first node that corresponds to the write location, and updating the data valid indicator and the data verified indicator, within the first node, which correspond to the write location. Further the method includes generating the write command, which includes the write location and the data value. Further, the method includes choosing a type of command to generate as either a next write command or a next read command, and generating either the next write command or the next read command, and repeating the processes of choosing the type of command to generate and generating the next write command or the next read command until a determination is made that all commands for the test are done being generated.

In a further embodiment, the method includes choosing a write location that will be included in a write command, where when the write command is later executed, the write command will cause the software model to attempt to write data to the write location. The method also includes storing a data value that indicates what data the write command will include into a data structure, referred to as a node, which is used to store data values for a block of locations. The method further includes updating a data valid indicator to indicate that, after the write command is executed, valid data should exist at the write location, and updating a data verified indicator to indicate that, after the write command is executed, the data at the write location has not yet been verified with a subsequent read command to be the same as the data value. The method further includes generating the write command, which includes the write location and the data value. The method further includes choosing a read location that will be included in a read command, where when the read command is later executed, the read command will cause the software model to attempt to read data from the read location, and updating the data verified indicator to indicate that, after the read command is executed, the data at the read location has been verified by the read command. Further, the method includes generating the read command, which includes the read location.

Various embodiments also provide a method for testing a software model of a hardware device. In one embodiment, the method includes retrieving a write command from a sequence of transactions that includes one or more write commands and one or more read commands, where the write command was generated by the methods of the various embodiments described above. The method further includes sending one or more messages to the software model, where at least one of the one or more messages includes the write location and the data value.

Further embodiments of the invention include computer-readable media for storing instructions for performing the various embodiments of the method, and computer systems on which the various embodiments of the method are executed.

Because they enable test commands to be generated in a more random manner, embodiments of the invention enable software models of hardware devices to be tested in a more flexible, robust, and concise manner than prior art methods. Further features and advantages of the present invention, as well as the structure and operation of various embodiments, are described in detail below with reference to the accompanying drawings.

DESCRIPTION OF THE EMBODIMENTS

In the following detailed description of the preferred embodiments, reference is made to the accompanying drawings which form a part hereof, and in which is shown by way of illustration specific embodiments in which the inventions may be practiced. These embodiments are described in sufficient detail to enable those skilled in the art to practice the invention, and it is to be understood that other embodiments may be utilized and that process or mechanical changes may be made without departing from the scope of the present invention. It will be recognized that the methods of the various embodiments can be combined in practice, either concurrently or in succession. Various permutations and combinations will be readily apparent to those skilled in the art.

The various embodiments of the invention, described in detail herein, involve new and novel ways of generating a read/write location table, which will be used in a simulation environment to test a software-implemented model of a device (i.e., a "device under test" or "DUT"). The embodiments of the present invention have several significant advantages over prior art methods. First, the embodiments of the invention provide a test command generation method that generates commands corresponding to more concise and flexible tests. Specifically, the embodiments of the invention provide a test command generation method that allows read commands to be generated in a different sequence from previously generated write commands. Further, the embodiments of the invention provide a test command generation method that allows multiple write commands for a particular location to be generated, regardless of whether a read command to verify the data has been generated. In addition, the embodiments of the invention enable read commands to be more varied and flexible (e.g., allowing read commands that specify different data sizes and different masks than the data sizes and masks specified in previously generated write commands). Also, in connection with read commands that are variable and flexible, embodiments of the present invention maximize the amount of data that is newly verified and minimize the amount of unnecessary reads (re-verification). Further, embodiments of the invention enable more test permutations to be performed for better test coverage, without requiring unreasonably lengthy command lists. Further, embodiments of the invention include test command generation methods that require less overhead (e.g., less memory) to execute.

Figure 1:
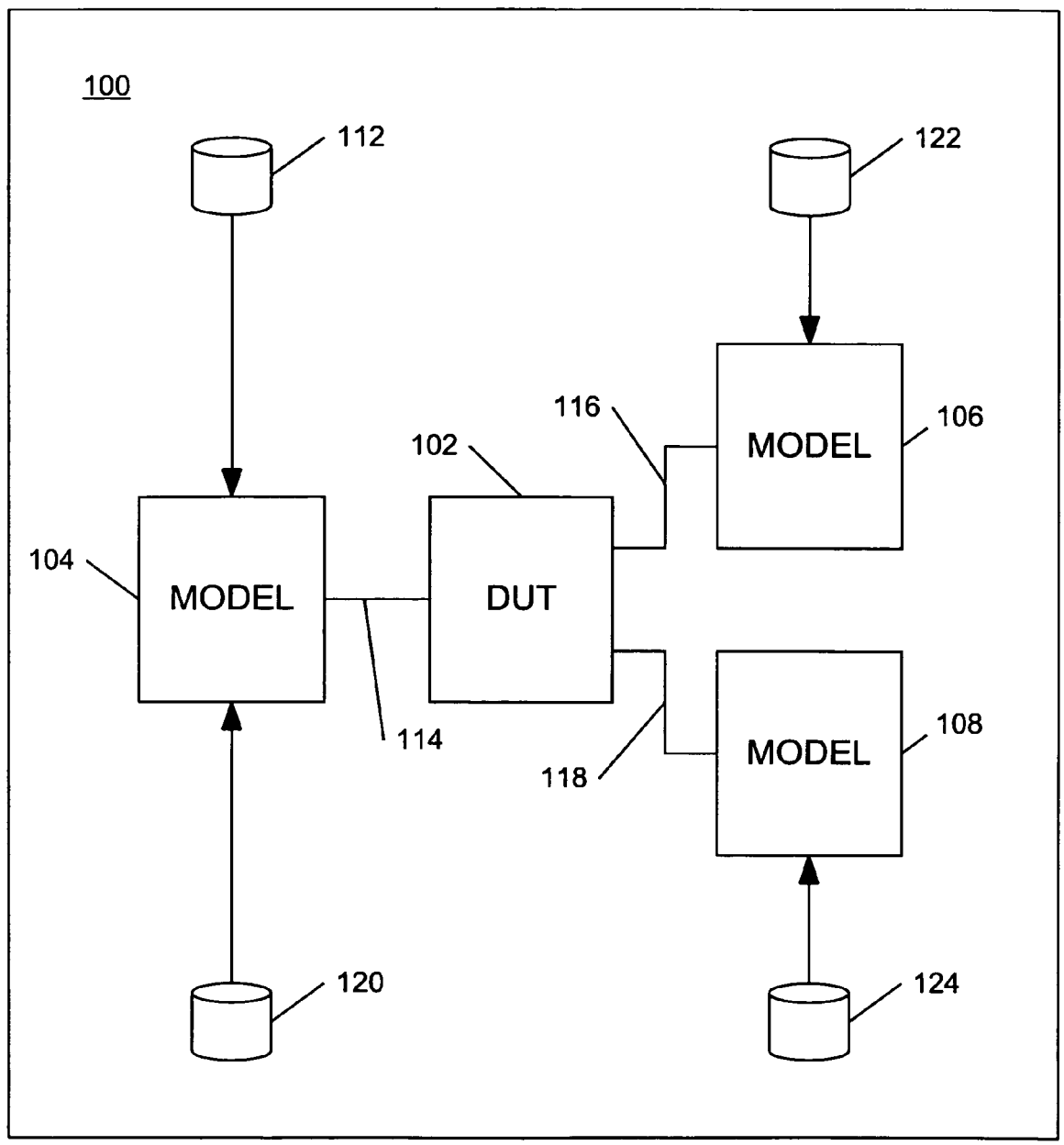
FIG. 1 illustrates a simplified block diagram of a simulation environment in accordance with an embodiment of the present invention.

FIG. 1 illustrates a simplified block diagram of a simulation environment 100 in accordance with an embodiment of the present invention. The simulation environment 100 is implemented in software and run on a general-purpose or special-purpose computer system. The simulation environment 100 is used to test and validate one or more components of a computer or other system. In various embodiments, the simulation environment can be provided by an off-the-shelf product, such as the ModelSim simulator by Model Technology, Inc. or the Verilog XL Simulator by Cadence Design Systems, Inc. Alternatively, the simulation environment can be a custom designed or proprietary package.

In simulation environment 100, computer system components can be modeled using one or more models 104, 106, 108, and a device under test (DUT) 102. The models 104, 106, 108 and the DUT 102 operate to simulate data exchanges between components of an operational computer system. Typically, each model 104, 106, 108 models the behavior of a computer system component or group of components whose operation is known, well defined, or otherwise considered reliable. In contrast, DUT 102 typically simulates a computer system component whose operation needs to be tested to ensure that it can operate reliably.

For example, in simulation environment 100, model 104 may simulate a host processor, DUT 102 may simulate a new or experimental system or memory control module, and models 106, 108 could simulate peripherals. When DUT 102 is a simple memory controller that accesses a single memory device (e.g., a DRAM), then only one peripheral model 106 would likely be included. When DUT 102 emulates a device (e.g., a system controller) that accesses multiple peripherals (e.g., memory devices, such as a disk controller, video controller or network adapter) then both peripheral models 106, 108 and possibly more models (not shown) would be included.

A simulated exchange of signals between the models 104, 106, 108 and the DUT 102 helps to ensure that DUT 102 operates reliably. The types of devices listed above are for purposes of example only, and should not be construed to limit the scope of the present invention, as the embodiments of the invention can be used to test a wide range of simulated devices.

Models 104, 106, 108 and DUT 102 are software programs that are typically written in a hardware description language. For example, Verilog HDL could be used, which is a hardware description language used to design and document electronic systems. Alternatively, for example, the programs could be written in the very high speed integrated circuit description language (VHDL), which was developed by the Institute of Electrical and Electronics Engineers (IEEE). Simulation environment 100 includes the necessary hardware description language interpreter or model/DUT program compiler required to execute models 104, 106, 108 and DUT 102.

One or more of the models can be designated as a control model, which is responsible for executing or interpreting commands to test the behavior of DUT 102. For example, in simulation environment 100, model 104 can be a processor model, and can be used as a control model to test DUT 102. In such an environment, commands 112 are passed to processor model 104. Processor model 104 then processes those commands and produces signals at interface 114. DUT 102 will respond to those signals. This may require DUT 102 to produce one or more additional signals on interfaces 114, 116, and/or 118, while adhering to the bus protocol on all interfaces 114, 116, 118. Models 104, 106, 108 may be required to access additional data 120, 122, 124 in order to respond to the signals produced by DUT 102. The bus protocol used by DUT 102, as well as the data patterns produced by DUT 102, are then verified.

For example, model 104 could be a processor model, DUT 102 could be a memory controller model, and model 106 could be a DRAM. As another example, DUT 102 could be a system controller model, and model 106 could be a disk controller. A read command may be provided to processor model 104 through interface 112. Model 104 would then interpret the command and produce a signal on interface 114 that has the proper protocol. DUT 102 will respond by producing a properly formatted read command on interface 116. After disk controller model 106 accesses the data 122 corresponding to the command's address, disk controller model 106 returns the data on interface 116. DUT 102 passes the data to processor model 104, and the data can then be verified.

By analyzing responses to read and write commands generated by the processor model 104, the design of the DUT 102 can be tested and validated. Bus protocol and read data patterns are also checked using capabilities provided by the simulation environment 100. If there is a discrepancy in the read data, an error message is generated.

Figure 2:
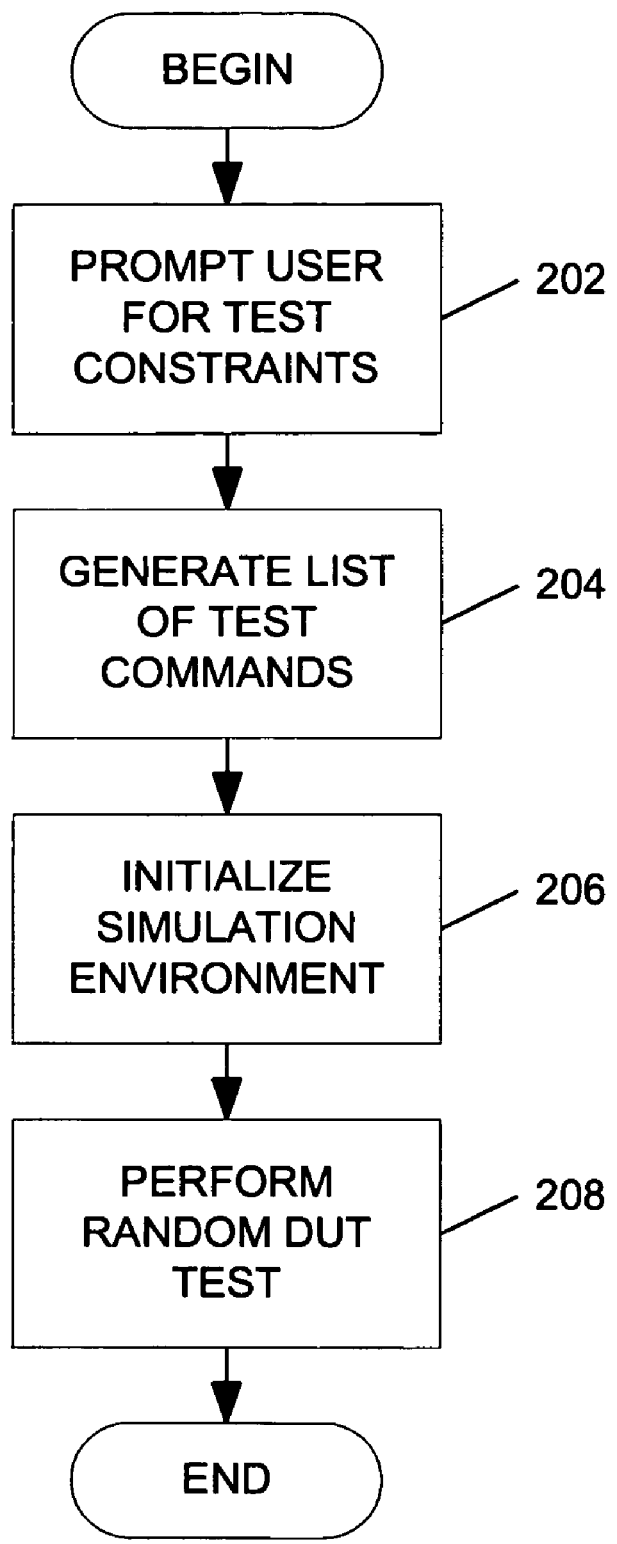
FIG. 2 illustrates a flowchart of a method for generating test data and testing a hardware model in accordance with an embodiment of the present invention.
Figure 3:
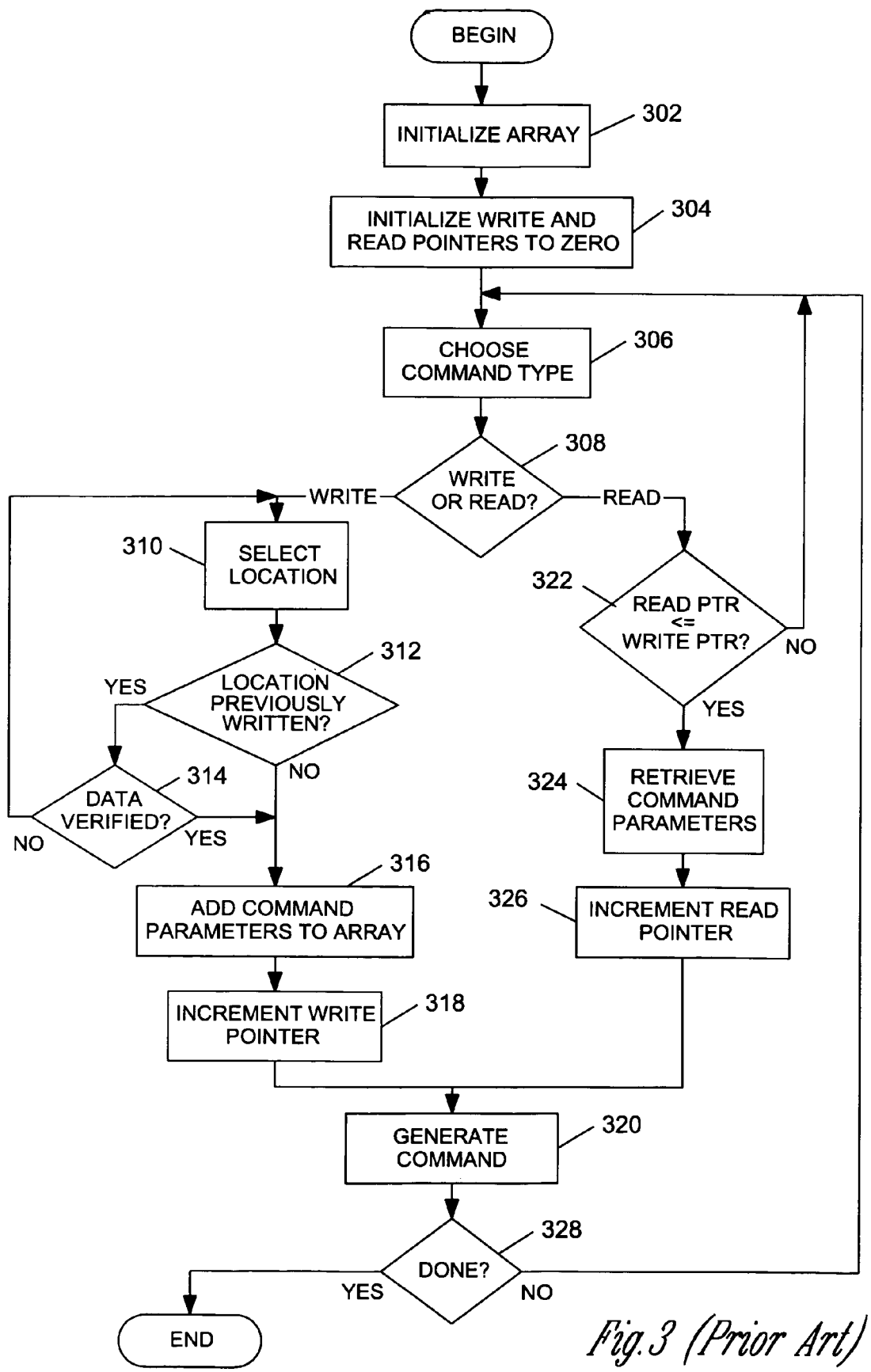
FIG. 3 illustrates a flowchart of a method for generating a command list in accordance with the prior art.

FIG. 2 illustrates a flowchart of a method for generating test data and testing a hardware model in accordance with an embodiment of the present invention. The method assumes that the software models of the device or devices under test have already been created.

The method begins, in one embodiment, by prompting a user for test constraints, in block 202, which will control the scope of the test commands to be generated. For example, a user may specify one or more of the following constraints: number of transactions (commands) to create; address range boundaries; percentage of location to re-write; transaction size (e.g., number of bytes that each command reads or writes); types of locations to be written to and read from (e.g., PCI, cacheable address, I/O or memory address, and whether memory may be locked); data mask size; test initialization parameters; read-to-write ratio; percentage of random masks; whether the process must attempt to use a chosen mask; and other variables and parameters. A number of other user-specifiable constraints are discussed in detail in U.S. patent application Ser. No. 09/128,704, by James Meyer, entitled "Bus Modeling Language Generator," filed on Aug. 4, 1998, now issued as U.S. Pat. No. 6,571,204 and incorporated herein by reference for any purpose.

Next, a list of test commands is generated, in block 204, according to the test constraints specified by the user. In one embodiment, the list of test commands includes a sequence of write commands to randomly or non-randomly selected locations, interspersed with read commands to some or all of those locations. The list of test commands is stored in a text file, in one embodiment. In an alternate embodiment, the list of test commands could be stored in a block of memory that is ultimately accessible by the simulation environment. Generating the list of test commands is discussed in detail in conjunction with FIGS. 4-8 and 10.

After the list of test commands is completed (i.e., a sequence of transactions has been created), then the DUT is actually tested. In one embodiment, this involves first initializing the simulation environment, in block 206. This may include, for example setting and/or clearing various registers and/or flags, and initializing memory locations and models.

In block 208, the random test of the software model of the hardware device (i.e., the DUT) is then performed. In one embodiment, this involves sequentially retrieving test commands from the sequence of transactions that makes up the list of test commands, and sending one or more messages to the software model, where at least one of the messages includes the location (or locations) and data specified in the test command. In some cases, where a test command pertains to writes or reads of multiple locations, the simulation environment may form and send multiple messages based off a single test command. If the test command is a read command, any read errors or other discrepancies are identified and reported. After the last command of the list has been executed, the method ends.

Embodiments of the present invention include methods for generating the list of test commands. As mentioned earlier, advantages to the embodiments of the present invention include the ability to generate read commands using a different sequence of locations than the previously generated write commands. In addition, another advantage is that multiple write commands to a single location can be made without requiring data to be verified between writes. In addition, the embodiments of the invention enable read commands to be more varied and flexible (e.g., allowing read commands that specify different data sizes and different masks than the data sizes and masks specified in previously generated write commands). Also, in connection with variable and flexible read commands, embodiments of the present invention maximize the amount of data that is newly verified and minimize the amount of unnecessary reads (re-verification). Further, embodiments of the invention enable more test permutations to be performed for better test coverage, without requiring unreasonably lengthy command lists. Further, embodiments of the invention include test command generation methods that require less overhead (e.g., less memory) to execute.

Therefore, the embodiments of the present invention have several significant advantages over prior art methods. First, the embodiments of the invention provide a test command generation method that is more flexible and robust. Specifically, the embodiments of the invention provide a test command generation method that allows read commands to be generated in a different sequence from previously generated write commands. Further, the embodiments of the invention provide a test command generation method that allows multiple write commands for a particular location to be generated, regardless of whether a read command to verify the data has been generated. In addition, the embodiments of the invention enable read commands to be more varied and flexible. Also, in connection with variable and flexible read commands, embodiments of the invention maximize the amount of data that is newly verified and minimize the amount of unnecessary reads (re-verification). Further, embodiments of the invention enable more test permutations to be performed for better test coverage. Additionally, the various embodiments more efficiently use memory, so that overly large quantities of memory are not necessary to create sufficient commands to fully test a device, and so that the number of transactions within a device test is not limited by the amount of memory available to the test command generation program.

These advantages are achieved by eliminating the use of a sequential array that includes entries for each write command that the test generation program will generate, as is done in the prior art. Instead, embodiments of the present invention introduce the concept of a "node" to keep track of the state of the DUT. When a write location is selected in a block for which a write command has not yet been generated, embodiments initialize a node for that block. The node includes: an address field that identifies a data location in a target device; a data field into which data is stored; a field that indicates which data fields have valid data; and a field that indicates which data fields have been verified after the last write operation.

This organization and characterization of the test data enables read commands for previously written data to be generated in any order. In addition, some of the written data can be skipped or read multiple times, if desired. "Sub-verifies" also can be performed using embodiments of the invention, meaning that a wide variety of read sizes and masking can be specified, independently from the write sizes and masking. Additionally, the amount of data that is newly verified is maximized, and the amount of data that is unnecessarily re-read (re-verified) is minimized. Also, multiple writes to a location can be made without requiring the data to be read in between each write. Finally, the amount of memory consumed in generating the test commands, particularly for a very large test, can be significantly less than the amount of memory required using prior art methods.

The description of the various embodiments, below, assume that the DUT is capable of accessing multiple devices (e.g., the DUT is a system controller). Accordingly, the description, below, refers to choosing a device for which to generate a command. In alternate embodiments, the DUT might access only a single device (e.g., a DRAM). In such a case, it would not be necessary to choose a device for which to generate a command, nor would it be necessary to specify the device within the command.

In addition, the terms "address" and "location," as used in this description, are not meant to limit the scope of the invention to generating commands that write to or read from locations of a particular type of device (e.g., a memory device). Instead, the scope of the invention encompasses generating commands that write to or read from other types of devices as well. Therefore, the terms "address" and "location" are meant to refer to any uniquely identifiable data destination (or source) associated with a device, where the device could be a memory device, I/O device, PCI, cacheable address, or any of several other types of devices.

Figure 4:
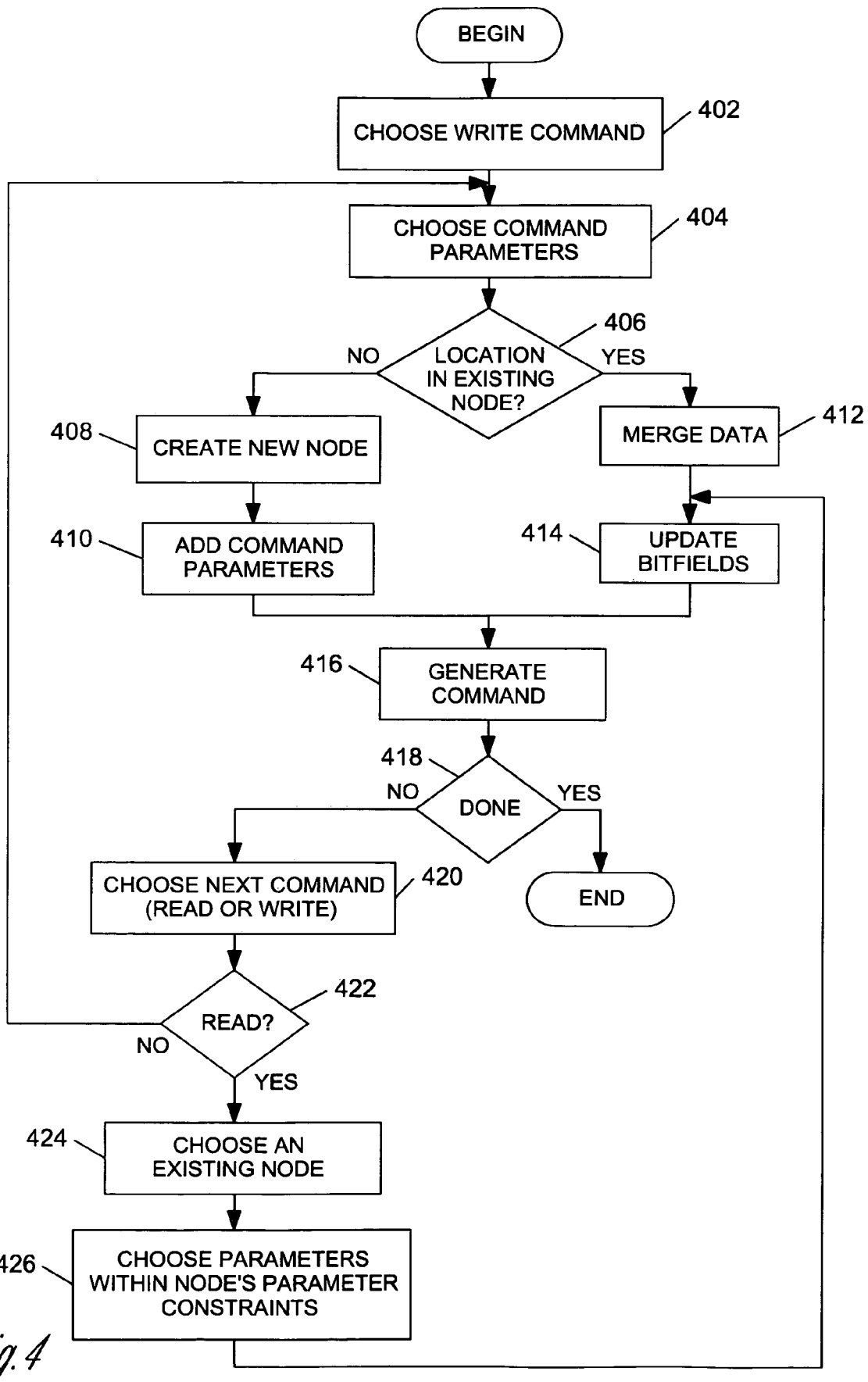
FIG. 4 illustrates a flowchart of a method for generating a list of transactions in accordance with an embodiment of the present invention.

FIG. 4 illustrates a flowchart of a method for generating a list of transactions in accordance with an embodiment of the present invention. The method begins, in block 402, by choosing to create a "write" type of command. Because at least one address location must be written to before a "read" (or verify) command is generated, the method chooses to create a "write" command as its first command.

Next, in block 404, command parameters are chosen. In one embodiment, the parameters that can be selected include, but are not limited to: device type (e.g., memory device, I/O, PCI, etc.); write locations; data values; transaction size (i.e., how many data locations the command will write to); and data mask value. Data masks, which may or may not be included in a command, are discussed in more detail later, in conjunction with blocks 410 and 426.

Selection of one or more parameters can be random, or the parameter selections can be affected by the user while the user is specifying test constraints. For example, a user may have previously specified various constraints including, but not limited to: a) one or more address ranges to test; b) a range of transaction sizes (e.g., each command writes or reads between 1 and 64 bytes); c) probabilities of selecting particular transaction sizes (e.g., choose a transaction size of 8 bytes 75% of the time); and d) parameters affecting how mask bits will be set (e.g., set all mask bits for 60% of commands, and randomly set mask bits for 40% of commands).

In one embodiment, block 404 is executed only when a write command is being created, and parameters for a read operation are selected elsewhere in the process flow (block 426). Accordingly, blocks 404, 406, 408, 410, and 412 pertain only to generating write commands.

As described previously, for a system controller, writes to multiple types of devices can be tested within the same set of test commands. Accordingly, parameter selection in block 404 involves selecting the type of device to write to (e.g., PCI, I/O, memory device, etc.). In other embodiments, all operations relating to a particular device type can be done together in a group, or only a single device type could be tested. In other embodiments, a DUT (e.g., a memory controller) may write to only a single other device (e.g., a DRAM). In such embodiments, it is not necessary to select and/or specify the device type in the write or read commands.

In addition, in block 404, a first write location within a user-specified range (or ranges) for that device could be chosen. In one embodiment, where the write location is randomly chosen, a random number generation program is used to randomly select the location. In other embodiments, the process could be semi-random or non-random. Alternatively, only read locations might be randomly selected (e.g., in block 426), while write locations are selected in a pre-defined order, or vice versa.

In any of these cases, a determination is made, in block 406, whether the selected location parameter falls within the boundaries of an existing node. As briefly described earlier, in one embodiment of the method, one or more "nodes" are created during test generation to keep track of the state of the DUT, rather than using a sequential transaction trace table, as was done in the prior art.

Figure 5:
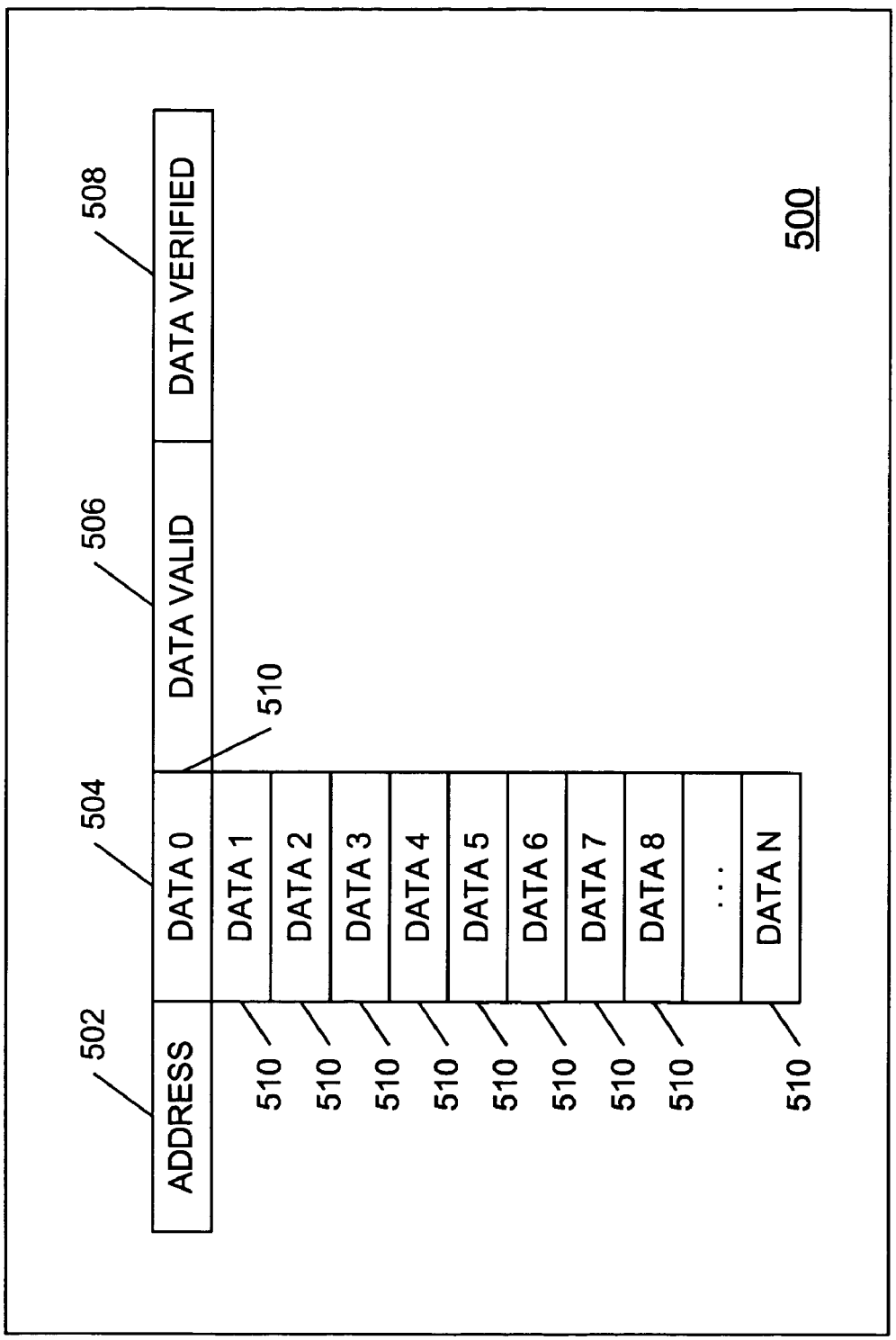
FIG. 5 illustrates a simplified diagram of a node in accordance with an embodiment of the present invention.

FIG. 5 illustrates a simplified diagram of a node in accordance with an embodiment of the present invention. In one embodiment, each node 500 includes: an address field 502; a data field 504; a data valid bitfield 506; and a data verified bitfield 508. The address field 502 includes a value that indicates which block of locations the node pertains to. The term "address field" is not meant to imply that application of the invention is limited to writing or reading memory devices. Instead, the address field 502 includes a value that can indicate memory locations, I/O locations, PCI locations, or writeable/readable locations in other types of devices.

For example, a node could be predefined to represent any 64 byte block within an address range, assuming that the first block, by definition, begins at the start of the address range, and that each block after the first block is consecutive and contiguous. Alternatively, a node could define a larger or smaller block of addresses or locations. In the given example, the address field 502 is used to store a value that represents a specific 64 byte block. In one embodiment, the stored value is the first location within the block. In another embodiment, the stored value indicates the location corresponding to the first generated write command, which may or may not be the first location in the block. In still another embodiment, the stored value indicates the last location within the block for which a write command was generated. Identifiers of some other locations within the block could alternatively be stored in address field 502. Regardless of which location identifier is stored, any location selected by the test command generation process can be normalized to the beginning of a block, in order to identify which node the location pertains to.

For ease of illustration, the description herein refers to storing bytes of data. In alternate embodiments, data could alternatively be stored in bits, words or other data sizes. Although the description, below, only discusses bytes, other data sizes are meant to be included within the scope of the invention.

Data field 504 includes a number, N, of data spaces 510 that corresponds to the block size. Thus, in the above example, data field 504 would include 64 data spaces, where each data space is a byte. Each time a write is made to a byte within the block, the data specified in the write command is stored in the data space corresponding to the write location. Thus, if a write command indicates that the third byte within a block should be written to, the data would be stored in the data space labeled DATA 2, in FIG. 5.

Data valid bitfield 506 includes one flag bit for each data space 510 in data field 504, in one embodiment. Accordingly, in the above example, data valid bitfield 506 includes a string of 64 bits. In one embodiment, each bit initially is clear, and is set when data is written to a data space. Accordingly, if the third byte is written to, then the third bit in bitfield 506 would be set. In another embodiment, each bit could be initially set, and cleared when data is written to a data space. Either way, each bit is an indicator of whether or not valid data exists in a data space. The description below assumes, but is not limited to, a bit being set when valid data exists in a data space.

Data verified bitfield 508 also includes one flag bit for each data space 510, in one embodiment. Each bit is set or cleared depending on whether the data in a data space 510 has been verified. Accordingly, when a write command is generated for a particular data space 510, the bit within bitfield 508 that corresponds to that data space is cleared, indicating that the written data has not been verified. When a read command is generated for a data space 510, the bit corresponding to the data space is set, indicating that the data has been verified. In another embodiment, each data verified bit could be set when a write command is generated, and cleared when a read command is generated. Either way, each bit is an indicator of whether or not verified data exists within a data space. The description below assumes, but is not limited to, a bit being set when verified data exists in a data space.

Theoretically, only a single node is necessary to store the state of the DUT, where that single node would include data spaces (e.g., spaces 510) that correspond with the number of locations being tested. However, in one embodiment, the locations being tested are broken into blocks (e.g., 64 byte blocks), and a node can be created for one or more of those blocks. Accordingly, in one embodiment, multiple nodes are created during the test command generation process, where each of the multiple nodes corresponds to a block of locations being tested.

Figure 6:
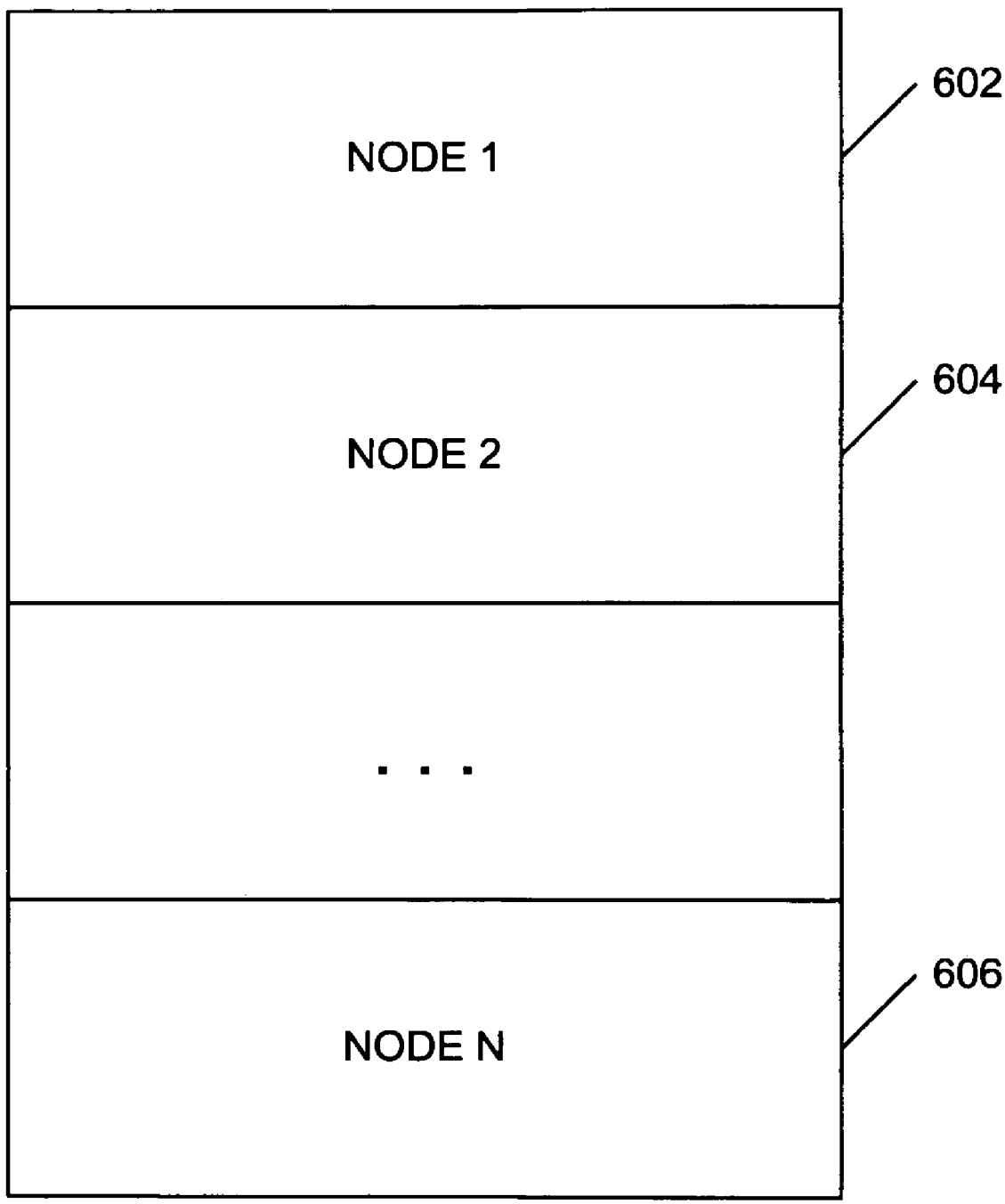
FIG. 6 illustrates a memory arrangement for a group of nodes in accordance with an embodiment of the present invention.

FIG. 6 illustrates an example of a memory arrangement for a group of nodes 602, 604, 606 in accordance with an embodiment of the present invention. Node 602 corresponds to the first created node, which may or may not correspond to the first location block within the location blocks being tested. More likely than not, node 602 will not correspond to the first location block, since the first chosen location parameter is randomly selected, in one embodiment. Similarly, node 604 may or may not correspond to a location block that consecutively follows the location block corresponding to node 604.

If a very small block of locations are being tested, then only one or a few nodes 602 may need to be created, and only a very small amount of memory needs to be used during the test command generation process. If a very thorough test is performed, in which all locations are tested, then the number of nodes ultimately will equal the number of all locations divided by the number of locations represented by each node. Accordingly, if there are a total of 64,000 locations, and 64 locations are included within each node, then 1000 nodes ultimately will be created, if all locations are ultimately tested.

In some cases, some or all locations may be written to or read from multiple times during a single test. Using prior art methods, a history array that would be created for such a test would be extremely large, consuming large amounts of memory. One advantage to the embodiments of the present invention is that, no matter how many times the locations are written to or read from, the amount of memory consumed by the nodes is limited. Instead of each new write command using additional memory, as is done in the prior art, each write to a location is performed within the same data space 510 (FIG. 5) within a node, in one embodiment of the invention.

Referring back to FIG. 4 and block 406, the determination of whether the chosen location parameter falls within the range of an existing node is made by comparing the chosen location parameter with the value in address field 502 (FIG. 5) for each node that currently exists. If necessary, the chosen location parameter and/or the node's address field value 502 are normalized to the beginning of the block to which the node pertains, in order to make the comparison easier.

If it is determined that the location parameter does not fall within the range of an existing node, then a new node is created, in block 408. Creation of a new node involves setting up a new data structure having a node format (e.g., format 500, FIG. 5), and initializing the values within the various fields of the new node. For example, a location is written into the address field 502. As discussed previously, the location can be the chosen location parameter. Alternatively, the chosen location parameter can be normalized to the beginning of the corresponding data block, and the beginning location of the block can be stored in the address field 502. In addition, the data field 504, data valid bitfield 506, and data verified bitfield 508 are initialized to zero, in one embodiment.

After creating and initializing a new node, the chosen command parameters are added to the new node in block 410. If the transaction size is 1, meaning that each write command is used to write a single location, this involves storing the data parameter in the data space 510 (FIG. 5) corresponding to the selected location. In addition, the bit corresponding to the location is set within data valid bitfield 506.

If the transaction size is greater than 1, then multiple bytes are stored in multiple data spaces 510, and multiple bits within the data valid bitfield 506 are set. In one embodiment, a data mask is used in performing a multiple byte write (or read). The way that the write (or read) is performed depends on the transaction size and also on the value within the data mask. An example will clarify the concepts.

Assume that the selected location corresponds to the eighth byte in a 64-byte block, and that a transaction size of 4 bytes has been pre-specified by a user or has been selected for a particular command. For example, if a block begins at location "F0C0" hexadecimal, then the eighth byte would have a location "F0C7." Without the concept of a mask, this means that 4 bytes of data would be written to 4 consecutive locations, starting at location F0C7.

With the concept of a mask, each of the 4 consecutive locations may or may not be written to, depending on the values of the mask bits. If the number of mask bits equals 4, which is the transaction size, then each mask bit corresponds to one of the 4 byte locations. Accordingly, if the mask value is "09" hexadecimal (i.e., "1001" binary), then only bytes corresponding to locations F0C7 and F0CA would be written to, and bytes corresponding to locations F0C8 and F0C9 would not be affected. The example given in this description assumes that a mask bit is set when the corresponding byte (or bytes) should be written to or read from, and cleared when the corresponding byte (or bytes) should not be accessed. The opposite could be true in an alternate embodiment.

In one embodiment, the number of mask bits can be less than the transaction size. In such an embodiment, each mask bit applies to more than one byte of data. The number of data bytes that each mask bit applies to is called the mask granularity or "maskgran." The value of maskgran equals the transaction size divided by the number of mask bits.

For example, assume that the transaction size is 4, and that a two-bit mask is used. In order to determine which bytes should be written to, the maskgran value is first calculated. In this case, maskgran=4/2=2. Accordingly, each mask bit applies to two bytes of data. For example, if the mask value is "01" binary, then the first two bytes of the 4 byte transaction would be written to, but the last two bytes of the transaction would not be written to, since the least significant mask bit is set, and the most significant mask bit is clear. In the above example, where the selected location corresponds to the eighth byte, and the transaction size is 4, this means that bytes corresponding to locations F0C7 and F0C8 would be written to, and bytes corresponding to locations F0C9 and F0CA would not be written to.

As a different example, assume the transaction size is 64 bytes, the mask size is 8 bits, and the mask value is "88" hexadecimal (i.e., "10001000" binary). Maskgran would equal 64/8=8. Thus, each mask bit corresponds to 8 bytes of data. Accordingly, when the write command is executed, the mask specifies that data would be written to bytes 24-31 and 56-63, which correspond to the fourth and eighth mask bits being set. Since all other mask bits are clear, data would not be written to the bytes corresponding to those bits.

Referring again to block 406, if the chosen location parameter does fall within the range of an existing node, then the chosen data parameters are merged into the existing node, in block 412. In one embodiment, this involves writing one or more bytes of data into the data spaces 510 (FIG. 5) corresponding to the chosen location or locations.

In addition, the corresponding bits in the data valid bitfield 506 (FIG. 5) are updated (e.g., set), in block 414, indicating that valid data exists in the one or more data spaces 510. The corresponding bits in the data verified bitfield 508 are also updated (e.g., cleared), to indicate that the data has not yet been verified with a read command. The process of updating the bitfields is discussed later in more detail in conjunction with FIG. 7.

Because the embodiments of the invention use indicators of whether a certain piece of data is valid and verified, it is possible to write to a data location multiple times without requiring an intervening read (verify) operation. This presents an advantage over prior art methods, which would not allow a write operation to a previously written location, unless the previously written data had been verified. Accordingly, the embodiments of the invention allow more flexible and robust tests to be generated.

After updating the bitfields in block 414, or adding command parameters within a new node, in block 410, the write command is generated, in block 416. This involves creating a command having the appropriate format for the simulation environment, and storing that command in a sequential list of test commands. Ultimately, the completed list of test commands is stored in a text file, in one embodiment, that is read by the simulation code during the simulation test.

In one embodiment, a write command includes the following parameters: command type (write); device type; address; data; and mask value. An example of a write command is:

write (MEM, addr=>x"4005FAC0", data_value=>x"E0A12F06", mask=>x"06").

Assuming a mask granularity of 1, the above command would cause two bytes of data (A1 and 2F) to be written starting at location 4005FAC1 of a memory (MEM) device. In alternate embodiments, the write command does not include a mask. Accordingly, each write command, when executed, would write beginning at the given location. In still another alternate embodiment, a transaction size (e.g., 2, 4, 8, or 64 bytes) could be specified in the command.

After generating the command, a determination is made, in block 418, whether or not the method is done generating commands. In one embodiment, this determination is made when the user-specified test constraints relating to test duration have been satisfied. For example, if the user specified a number of transactions (i.e., read and write commands), then the method is done when the appropriate number of commands has been generated. Other constraints also or alternatively could be used to determine whether or not the test command generation process is complete. If the method is done, then the process ends.

If the method is not done, then a next command type is chosen, in block 420. In one embodiment, the chosen type can be either a read or a write command type. A determination is made, in block 422, whether the command type is a read. If not (i.e., the command type is a write), then the method returns to block 404 and iterates as shown.

If the command type is a read, then one of the previously created nodes is selected, in block 424. If only a single node currently exists, then that node would be selected. If more than one node exists, indicating that write commands have been generated for data locations in multiple blocks, then one of the existing nodes is selected. In various embodiments, node selection could be random or non-random. Non-random selection could be based on various constraints. For example, node selection could depend on whether data has been verified within a node, or whether a specific data block is being verified, or whether data is being verified in a sequential or other manner.

After a node has been selected, read command parameters are chosen within the constraints of the selected node's parameters, in block 426. Specifically, a read location is chosen that includes valid data, as indicated by a potential location's corresponding bit in the data valid bitfield 506. Since the location can be chosen merely on the basis of whether or not the location has valid data, embodiments of the present invention enable much more flexibility than prior art methods, in which the read location is determined by sequentially stepping through locations selected during previous write operations. Instead, using embodiments of the present invention, the chosen read locations can jump through written data in an order that is wholly different from the order of the writes.

In one embodiment, a user can specify that he or she wants a certain percentage of reads to be performed on previously unverified data. Accordingly, in one embodiment, block 426 can take this consideration into account when choosing the read location. Specifically, block 426 can also evaluate the data verified bitfield 508 (FIG. 5) in selecting a location, where the method would select a previously unverified location, if possible. In alternate embodiments, block 426 would not consider the data verified bitfield 508.

Figure 10:
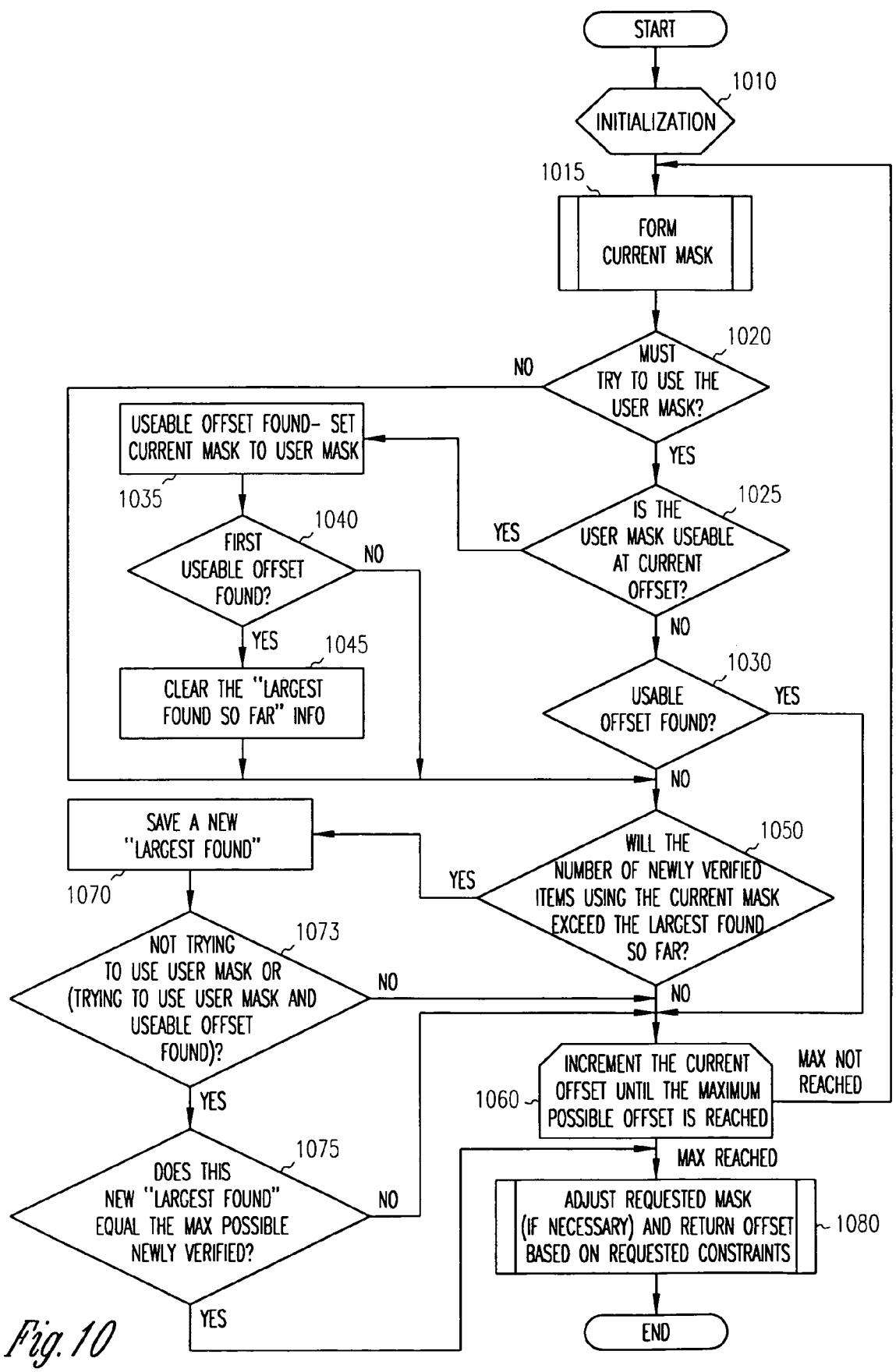
FIG. 10 illustrates a flowchart of a method for selecting data to verify in accordance with an embodiment of the present invention.

Still referring to FIG. 4, block 426 generates parameters for a read command (e.g., device type, address, data size, expected data, and mask value) based on the user supplied constraints. FIG. 10 outlines in detail this generation of parameters in one particular embodiment of the invention.

In generating a read command, an embodiment of the invention maintains the user's requested constraints (e.g., the user supplied write to read ratio) when choosing transaction parameters across all the writes and reads generated. In the case of read commands, the system maintains probabilities associated with these requested constraints by selecting a node and data within the node that best matches the chosen transaction parameters. In one embodiment, an aspect of satisfying this "best match" requirement is to make sure that each read command maximizes the amount of newly verified data. Based on the type of testing that the user wishes to perform, user constraints may specify that the system generated mask value (hereinafter referred to as the User Mask—the mask chosen based on the user's requested constraints) must be strictly adhered to (e.g., the user supplied constraint indicating the system must try to use the User-Mask). In another embodiment, the user may not care if the User-Mask value is strictly adhered to, but instead may be more concerned with adhering to the requested write to read ratio. In both embodiments however the system maximizes the amount of newly verified data. Additionally, it can be seen by those skilled in the art that strictly adhering to a User-Mask value (such as one that is chosen randomly) will typically not allow for more newly verified data items than the other embodiment. The following example illustrates how an embodiment functions to generate a read command that best satisfies these cases.

Referring specifically now to FIG. 10, Block 1010 initializes variables. For example, variables Offset, Current-Offset, Best-Offset, Best-Mask, and Largest-Found are set to zero, the Useable-Mask-Found flag is cleared, and the value for variable Bits-To-Compare is calculated as described in the details below for block 1050. Offset is the value returned from the process in block 1080 where the read should start (i.e. the result of the search for the best case read transaction). Current-Offset indicates the location or position in the node's data field at which the process is currently searching for data to verify. Related to the Current-Offset is the Alignment, which is based on user supplied constraints, and which determines the number of positions that the Current-Offset is increased for each iteration as the process searches through the node's data field. Largest-Found holds the count of the largest number of newly verifiable data items found so far. Each time that Largest-Found is updated with a new largest value for the number of newly verified data items, the Current-Offset is saved into Best-Offset and Current-Mask is saved into Best-Mask so that after all the iterations are complete, the program can retrieve this information to build the read transaction.

After initialization, Block 1015 forms a Current-Mask. The Current-Mask is formed by indexing into a Valid-Items field using the Current-Offset, and copying the corresponding flag values (flags are typically represented as bits in a multi-bit data structure) into Current-Mask (the items that are valid and the items that are verified are identified in fields 506 and 508 in FIG. 5). Therefore, the flags set in Current-Mask correspond to the valid items in the node's data field, starting at a location in the node's data field identified by Current-Offset and including the number of items determined by the given Data Size value (from user supplied constraints), since the Valid-Items field indicates on an item by item basis the locations in the node's data field where data has been written and consequently where data can be expected to be found. It can be seen that, over time and many transactions of different sizes and masks, these Valid & Verified fields can become fragmented on a byte by byte basis, a word by word basis, or some other segment-size of memory, and on a mixture of any of these sizes. It is this fragmentation which makes the choice of read data so complex when combined with the desire to maintain various probabilities and constraints.

In another embodiment, a decision is made in block 1020 whether to use the Current-Mask, i.e. the mask generated by this function (Block 1015), or to use the mask supplied as an input parameter to this function, the User-Mask. This decision can be made based on another parameter (such as the user supplied constraint indicating that the system must try to use the User-Mask) or other user-selected constraints. If the choice is made to use the Current-Mask, the process drops down to Block 1050, which will be explained in detail infra. If the choice is made to use the User-Mask, the process in Block 1025 determines if the User-Mask is a "useable" mask. In one embodiment, a "useable" mask is a sub-mask of the Current-Mask. To determine if the User-Mask is a sub-mask of the Current-Mask, the User-Mask and Current-Mask are logically ANDed, and if the result equals the User-Mask then it is a sub-mask of the Current-Mask. This check is performed because the possibility exists that the User-Mask cannot be used. This could occur if there is no offset that can be chosen such that the User-Mask will match a set of Valid items—in other words, there is no valid data that can be read to match the User-Mask, regardless of the value chosen for Offset. If the User-Mask is not a useable mask, and if a usable mask was found previously (Block 1030), the Current-Offset is incremented in Block 1060. Then, if the maximum offset is not yet reached, a new Current-Mask is formed in Block 1015 and the mask check in Block 1020 is performed again. However, if a useable mask was not found previously, the process proceeds to block 1050 where a check is made to see if the Current-Mask results in a larger number of newly verified items. This is done so that if a useable mask is never found (i.e., the User-Mask cannot be used), a best case mask and offset are saved.

However, if the User-Mask is a useable mask (Block 1025), the Useable-Mask-Found flag is set in Block 1035 and the Current-Mask value is changed to the User-Mask value. Then, if this is the first usable offset found at Block 1040, Largest-Found is set to zero at Block 1045 so that a search is commenced to find the largest useable mask, and the process to maximize the number of newly verified items in Block 1050 is initiated. This path through blocks 1035-1045 is used to re-initialize the "find largest" counters so that the largest number of newly verified items are found for the User-Mask. Until a useable offset for the User-Mask is found, Largest-Found is tracked on Current-Mask assuming that a useable offset for User-Mask may not be found. Once a useable offset has been found, block 1030 provides a path around the compare block at 1050 (when the compare in block 1025 results in an non-useable mask) so that every Current-Mask value that is generated in block 1015 is not checked, but only those that result in a "useable" case—i.e. the User-Mask is a sub-mask and thus can be used.

In one embodiment of the invention, Block 1050 compares the number of items that will be newly verified using the Current-Mask with the value saved in Largest-Found. If the number of items newly verified is greater than Largest-Found, the process proceeds to block 1070, otherwise the process proceeds to block 1060. The Current-Mask may have been changed to the value in User-Mask (in block 1035) if the process is trying to use the User-Mask and it was determined to be useable at the Current-Offset (block 1025).

The details of Block 1050 in this embodiment are as follows. Block 1050, in which the determination is made whether the number of newly verified items using the Current-Mask will be greater than the value stored in Largest-Found, is best illustrated by an example. In this example, a 32 bit data field has the following Valid-Items and Verified-Items as indicated below.

Valid Items: 43 C7 0F FF (hex) 0100 0011 1100 0111 0000 1111 1111 1111 (binary)

Verified Items: 00 00 03 3F(hex)0000 0000 0000 0000 0000 0011 0011 1111 (binary)

Therefore, counting from the right to the left most bits, items 0-11, 16-18, 22-25, and 30 are valid. Similarly, items 0-5, and 8-9 are verified.

To determine how many items would be newly verified, we perform a logical operation on the Valid-Items and Verified-Items as follows—Valid-Items AND NOT Verified-Items (Valid-Items is logically ANDed with the inverse (logical NOT) of Verified-Items). In the present example, the result is:

Valid Items: 43 C7 0F FF (hex) 0100 0011 1100 0111 0000 1111 1111 1111 (binary)

Verified Items:00 00 03 3F(hex) 0000 0000 0000 0000 0000 0011 0011 1111 (binary)

NOT (Verified

Items): FF FF FC C0 (hex) 1111 1111 1111 1111 1111 1100 1100 0000 (binary)

Valid Items AND

NOT (Verified

Items): 43 C7 0C C0 (hex) 0100 0011 1100 0111 0000 1100 1100 0000 (binary)

The result of this logical AND is stored in Bits-To-Compare during initialization (block 1010). Bits-To-Compare therefore has its bits set to indicate all the valid items that have not been verified (i.e., potential newly verifiable items).

Current-Mask is then logically ANDed with Bits-To-Compare starting at Current-Offset, and the number of bits that are set is counted. In the current example, assume that Current-Offset is now at 16 and the given Data Size is 8 (from user supplied constraints). Referencing the Valid-Items AND NOT (Verified-Items) bitfield above (which was stored in Bits-To-Compare) and counting from right to left, the Data Size of 8 bits starting at offset 16 are 1100 0111. As can be seen, this would result in five newly verified items (counting the number of 1's).

This value is the number of newly verified items for the Current-Mask, which is compared to the Largest-Found. If this value is greater than Largest-Found (Block 1050), this then becomes the new Largest-Found (Block 1070), and the Current-Offset is saved in Best-Offset and the Current-Mask is saved in Best-Mask. Next, in block 1073, if the process is NOT trying to use the User-Mask, OR if the process is trying to use the User-Mask AND the process has found a useable offset, the process proceeds to the check in block 1075—otherwise the process proceeds to block 1060. In block 1075, the process checks to see if the new value for Largest-Found is the Max-Able-To-Verify. The Max-Able-To-Verify can be one of two values depending on the requested option to try to use the User-Mask. If the request was made to try to use the User-Mask, Max-Able-To-Verify is simply the number of bits set in the User-Mask. If the process does NOT have to try to use the User-Mask, Max-Able-To-Verify is simply the value for Data Size. Therefore, if Largest-Found is now equal to Max-Able-To-Verify, the best case has been found and the process proceeds to the final block 1080. If not, the process continues on to block 1060. This check is performed so that as soon as the best case is found the algorithm will exit instead of wasting time going through the remainder of the loops.

The Current-Offset is then incremented by the value of Alignment (Block 1060), and this becomes the new starting point in the node for the next iteration. The process is repeated until the specified end condition is encountered (e.g., Current-Offset plus Data Size is greater than or equal to the number of data items in the node).

After the process has completed its iteration through the node (Block 1080), the read command is generated based on the information gleaned from the iteration. Offset is set to the offset value that was saved in block 1070, Best-Offset. Specifically, the exact address to read in the node is the address of the node plus the Offset returned by block 1080. The mask used in the generated read command will be the mask value that was saved in block 1070, Best-Mask. This could be the same as the User-Mask if the request was made to use the given User-Mask and a useable offset was found in block 1030. It should be noted that even if the request was made to use the User-Mask, this condition may not have been satisfied and the resulting mask may be different because the condition could exist where it was impossible to use the User-Mask due to the organization of the node's Valid data. The expected data is the data pattern that begins at the node address plus the Offset, and has length of Data Size.

After choosing the read parameters (e.g., the read location), the bit or bits in the data verified bitfield 508 (FIG. 5) corresponding to the read parameters are updated, in block 414. Specifically, the bit or bits corresponding to the chosen location is updated (e.g., set), indicating that a command has been generated to verify previously written data at that location. A read command is then generated, in block 416.

In one embodiment, a read command includes the following parameters: command type (read); device type; address; data; and mask value. An example of a read command is:

read  (MEM,  addr=>x"4005FAC0",  data_value =>x"E0A12F06", mask=>x"06").

Assuming a mask granularity of 1, the above command would cause two bytes of data to be read starting at location 4005FAC1 of a memory (MEM) device, where the expected data at those locations is A1 and 2F. In alternate embodiments, the read command does not include a mask. Accordingly, each read command, when executed, would read beginning at the given location. In still another alternate embodiment, a transaction size (e.g., 2, 4, 8, or 64 bytes) could be specified in the command.

After generating a read command, in block 416, the procedure then iterates, as shown, until the method for generating test commands is done (i.e., the user-specified command generation constraints have been satisfied). At that point, the method ends.

Figure 7:
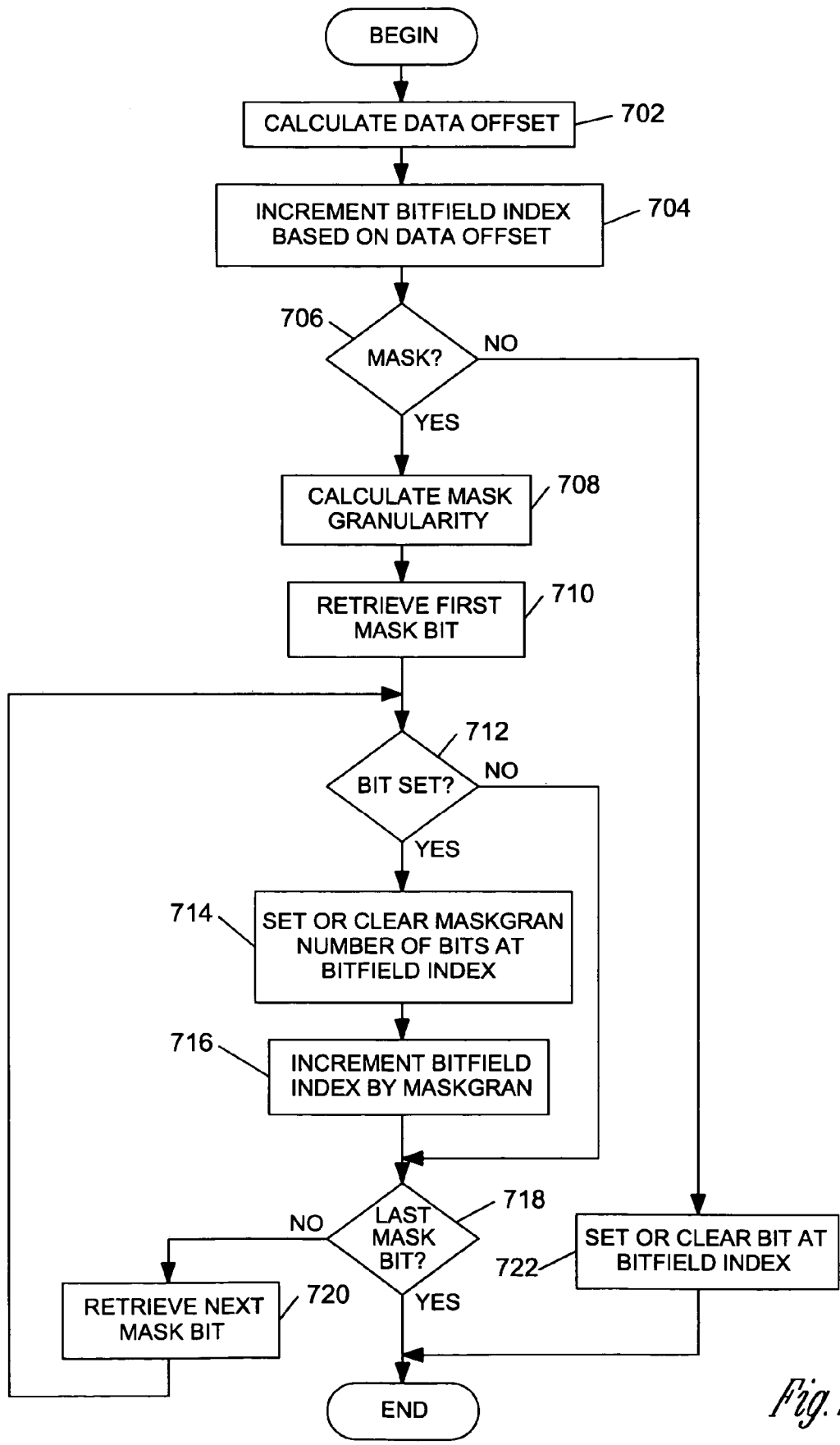
FIG. 7 illustrates a flowchart of a method for updating a bitfield in accordance with an embodiment of the present invention.
Figure 8:
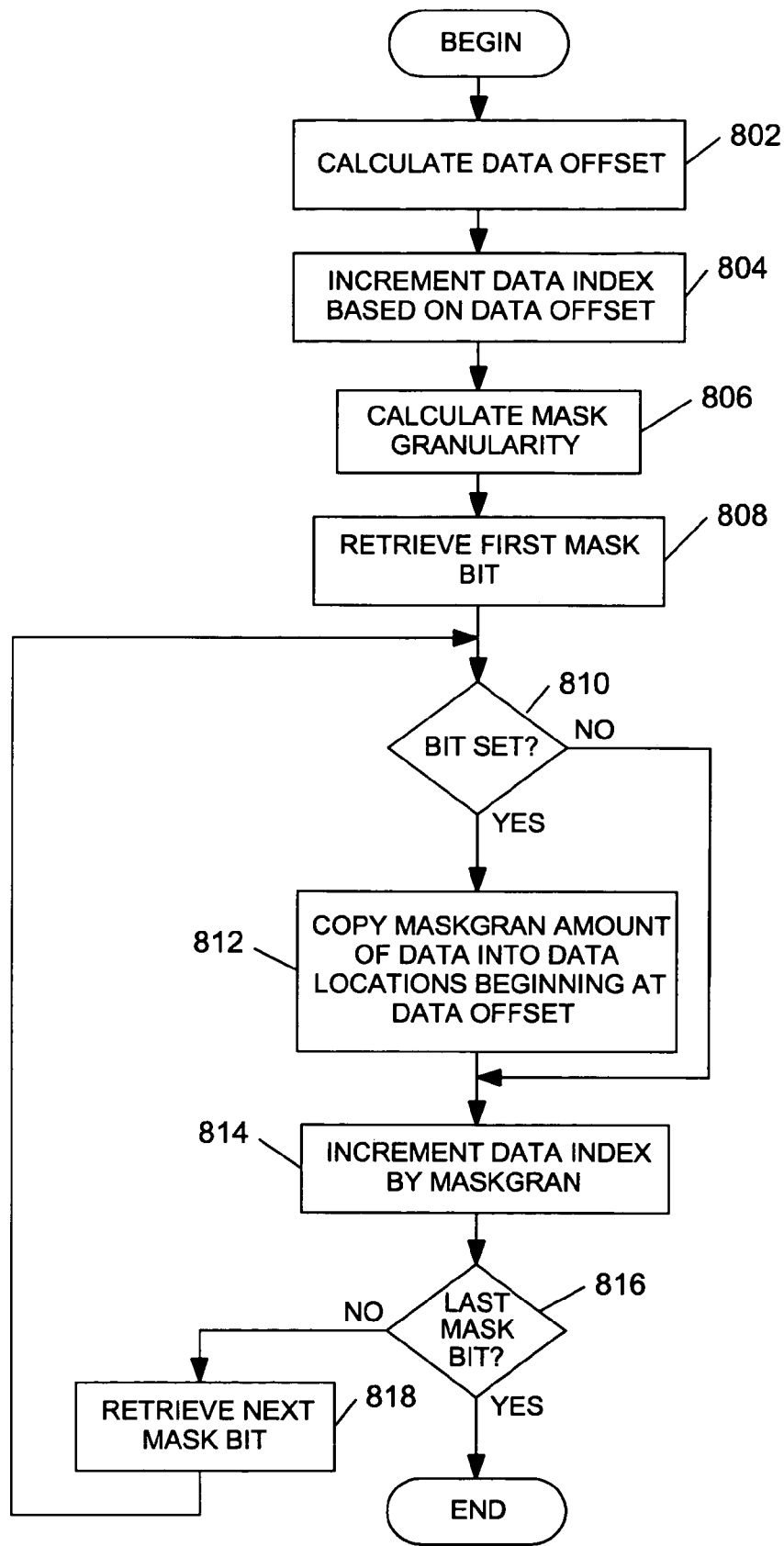
FIG. 8 illustrates a flowchart of a method for merging data in accordance with an embodiment of the present invention.

FIGS. 7 and 8 further describe methods for updating bitfields (e.g., block 414) and merging data into data fields (e.g., block 412) in accordance with various embodiments of the invention. Specifically, FIG. 7 illustrates a flowchart of a method for updating a bitfield in accordance with an embodiment of the present invention. In one embodiment, the method is performed in conjunction with block 414 of the flowchart of FIG. 4. The method is used to update one or more bits in either the data valid bitfield 506 or the data verified bitfield 508 (FIG. 5).

The description assumes that a data valid bit is set when valid data exists in a corresponding data location, and that a data verified bit is set when verified data exists in a corresponding data location. In alternate embodiments, the opposite could be the case. Specifically, in alternate embodiments, a data valid bit could be clear when valid data exists in a corresponding data location, and/or a data verified bit could be clear when verified data exists in a corresponding data location. Basically, each bit is an indicator of whether or not valid or verified data exists in a corresponding location.

When a write command is being generated, then both the data valid and data verified bitfields are updated (e.g., one or more bits are set in the data valid bitfield, and one or more bits are cleared in the data verified bitfield). In such a case, the method illustrated in FIG. 7 is executed twice: once to update the data valid bitfield, and once to update the data verified bitfield. Alternatively, the logic of the method can be altered to update both bitfields within a single pass through the method. When a read command is being generated, only the data verified bitfield is updated (e.g., one or more bits are set).

In one embodiment, at least two input parameters are passed to the update bitfield method. These parameters include an identification of which bitfield is being updated, and an indication of whether one or more bits are being set or cleared. For example, if bits within the data verified bitfield of the third node are being set, then a pointer to the location of that bitfield can be passed to the method, along with a boolean value of "1", which indicates a "set bit" request.

The method of updating a bitfield begins, in block 702, by calculating a data offset corresponding to the location within the write or read command. The purpose of calculating the data offset is to identify which bit (or bits) within the bitfield will be updated.

In one embodiment, this calculation uses the location chosen for the command (e.g., in blocks 404 or 426, FIG. 4) and the beginning location of the corresponding block. Basically, the latter location is subtracted from the former location, yielding the data offset. For example, if the eighth byte within a 64-byte block starting at location F0C0 is selected as a location parameter, the data offset would be 7, corresponding to location F0C7. In an alternate embodiment, the data offset could be retrieved from a temporary storage location, assuming that the data offset had been previously calculated.

In block 704, a bitfield index is incremented based on the data offset. Initially, the bitfield index has a value of zero. In the above example, where the data offset is 7, the bitfield index would be incremented to a value of 7.

A determination is then made, in block 706, whether or not a mask is associated with the command. If not, then the bit or bits (based on the transaction size) corresponding to the bitfield index are set or cleared according to the set/clear input parameter, in block 722, and the method ends.

If a mask is associated with the command, then the maskgran value is calculated, in block 708. As described previously, the maskgran value indicates how many locations each mask bit applies to. Accordingly, the maskgran value is calculated by dividing the transaction size by the number of mask bits. Therefore, for example, if the transaction size is 16 bytes, and the number of mask bits is 4, then maskgran=4, which means that each mask bit applies to four locations. In an alternate embodiment, the maskgran value could be retrieved from a temporary storage location, assuming that the maskgran value had been previously calculated.

In block 710, the first mask bit is retrieved. A determination is made, in block 712, whether the mask bit is set. If so, then beginning at the bitfield index, a maskgran number of bits are set or cleared, depending on the type of update, in block 714. Again, this assumes that a mask bit is set when it is valid. In an alternate embodiment, the opposite may be the case (i.e., the mask bit is cleared when it is valid).

Using the example above, if the command is a write command and the data valid bitfield is being updated, then the corresponding bits would be set. In the given example, bits 7, 8, 9, and 10 of the data valid bitfield would be set, since the bitfield index is 7 and each mask bit corresponds to 4 data locations. Alternatively, if the data verified bitfield is being updated in the context of a write operation, then the corresponding bits would be cleared. In the given example, bits 7, 8, 9, and 10 of the data verified bitfield would be cleared.

In block 716, the bitfield index is then incremented by maskgran. This, in the given example, the bitfield index would be incremented from its previous value of 7 to a new value of 11, since maskgran=4.

A determination is then made, in block 718, whether the last mask bit has been evaluated. If not, then the next mask bit is retrieved, in block 720, and the procedure iterates as shown. If so, then the method ends.

FIG. 8 illustrates a flowchart of a method for merging data in accordance with an embodiment of the present invention. The concept of merging data only applies in the context of a write command. The flowchart below assumes that a mask is used. In an alternate embodiment, where a mask is not used, the data to be written is simply stored in the data space within the node that corresponds to the selected write location, and most of the procedures illustrated in FIG. 8 are not performed.

The method for merging data is performed in conjunction with block 412 of FIG. 4, in one embodiment. The method begins, in block 802, by calculating a data offset. In one embodiment, this is performed in the same manner as was described in conjunction with block 702 of FIG. 7. In an alternate embodiment, the data offset could be retrieved from a temporary storage location, assuming that the data offset had been previously calculated.

In block 804, a data index is incremented based on the data offset. Initially, the data index has a value of zero. In the above example, where the data offset is 7, the data index would be incremented to a value of 7.

In block 806, the maskgran value is then calculated. As described previously, the maskgran value indicates how many locations each mask bit applies to. Accordingly, the maskgran value is calculated by dividing the transaction size by the number of mask bits. In an alternate embodiment, the maskgran value could be retrieved from a temporary storage location, assuming that the maskgran value had been previously calculated.

In block 808, the first mask bit is retrieved. A determination is made, in block 810, whether the mask bit is set. If so, then beginning at the data offset, maskgran number of bytes are written into data spaces (e.g., spaces 510, FIG. 5) within the node, in block 812. Again, this assumes that a mask bit is set when it is valid. In an alternate embodiment, the mask bit could be cleared when it is valid.

For example, if the data offset is 7, maskgran is 4, and the mask is "1001" binary, then for the first mask bit, four bytes of data are written into data spaces within the node, beginning at byte location 7.

In block 814, the data index is then incremented by maskgran. Thus, in the given example, the data index would be incremented from its previous value of 7 to a new value of 11, since maskgran=4.

A determination is then made, in block 816, whether the last mask bit has been evaluated. If not, then the next mask bit is retrieved, in block 818, and the procedure iterates as shown. If so, then the method ends.

Because embodiments of the invention can be executed on a computer or can be used to generate tests for a computer's component models, a description of a computer system is included herein.

Figure 9:
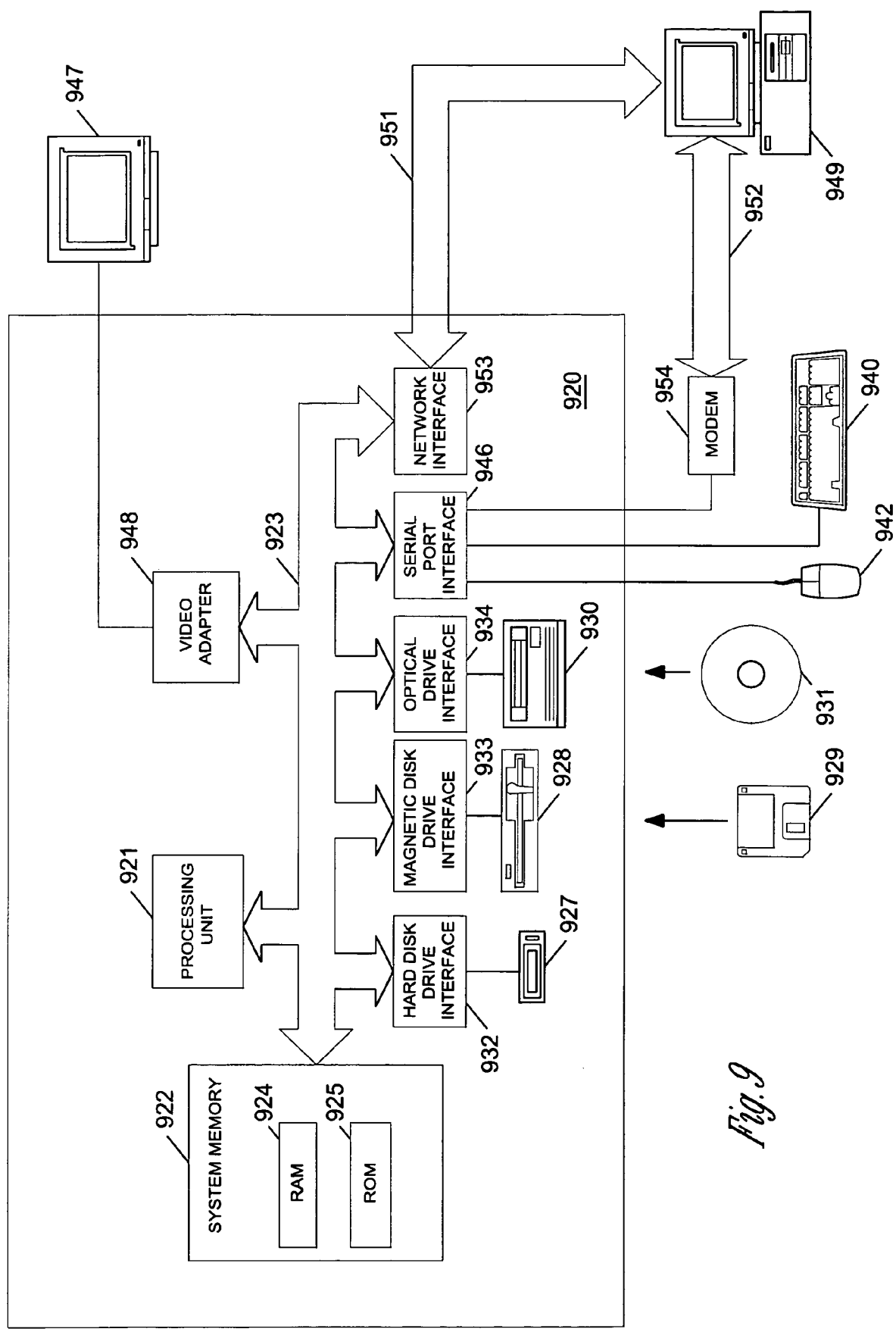
FIG. 9 illustrates a simplified block diagram of an exemplary computer system in accordance with an embodiment of the present invention.

FIG. 9 and the following discussion are intended to provide a brief, general description of a suitable computing environment in which embodiments of the invention may be implemented. In addition, FIG. 9 illustrates a system that includes components, models of which can be tested using a list of test commands generated using embodiments of the invention.

Embodiments of the invention are implemented in computer-executable instructions, such as program modules, being executed by a personal computer. Generally, program modules include routines, programs, objects, components, data structures, etc., which perform particular tasks or implement particular abstract data types. In various embodiments, the test command generation program could be coded in C, C++, Pascal, Fortran, Basic, or any of a number of other programming languages.

Those skilled in the art will appreciate that the embodiments of the invention may be practiced with or used to test components of other computer system configurations, including hand-held devices, multiprocessor systems, microprocessor-based or programmable consumer electronics, network PCs, minicomputers, mainframe computers, electronic sensing or monitoring devices, controllers, and the like. Embodiments of the invention may also be practiced in distributed computing environments where tasks are performed by remote processing devices that are linked through a communications network. In a distributed computing environment, program modules may be located in both local and remote storage media.

FIG. 9 illustrates a simplified block diagram of an exemplary computer system in accordance with an embodiment of the present invention. The exemplary system includes a general purpose computing device in the form of a conventional personal computer 920, including a processing unit 921, a system memory 922, and a system bus 923 that couples various system components including the system memory 922 to the processing unit 921. The system bus 923 may be any of several types of bus structures including a memory bus or memory controller, a peripheral bus, and a local bus using any of a variety of bus architectures. The system memory includes read only memory (ROM) 924 and random access memory (RAM) 925.

The personal computer 920 further includes a hard disk drive 927 for reading from and writing to a hard disk, not shown, a magnetic disk drive 928 for reading from or writing to a removable magnetic disk 929, and an optical disk drive 930 for reading from or writing to a removable optical disk 231 such as a CD ROM or other optical media. The hard disk drive 927, magnetic disk drive 928, and optical disk drive 930 are connected to the system bus 923 by a hard disk drive interface 932, a magnetic disk drive interface 933, and an optical drive interface 934, respectively.

The drives and their associated computer-readable media provide nonvolatile storage of computer readable instructions, data structures, program modules and other data for the personal computer 920. Although the exemplary environment described herein employs a hard disk, a removable magnetic disk 929, and a removable optical disk 931, it should be appreciated by those skilled in the art that other types of computer readable media which can store data that is accessible by a computer, such as magnetic cassettes, flash memory cards, digital video disks, Bernoulli cartridges, random access memories (RAMs), read only memories (ROMs), and the like, may also be used in the exemplary operating environment.

A number of program modules and data structures may be stored on computer-readable media, including the hard disk, magnetic disk 929, optical disk 931, ROM 924 or RAM 925. These program modules can include all or portions of a test command generation program and code associated with a simulation environment and associated models. In addition, the various computer-readable media also can be used to store test command data within one or more node data structures, and one or more text files that include lists of test commands generated by the test command generation program.

A user may enter commands and information into the personal computer 920 through input devices, such as a keyboard 940, pointing device 942, or other input devices (not shown). For example, a user may enter test constraints, which are used by the test command generation program. These and other input devices are often connected to the processing unit 921 through a serial port interface 946 that is coupled to the system bus, but may be connected by other interfaces, such as a parallel port, game port or a universal serial bus (USB). A monitor 947 or other type of display device is also connected to the system bus 923 via an interface, such as a video adapter 948. In addition to the monitor, personal computers typically include other peripheral output devices (not shown), such as speakers and printers.

The personal computer 920 may operate in a networked environment using logical connections to one or more remote computers, such as a remote computer 949. The remote computer 949 may be another personal computer, a server, a router, a network PC, a peer device or other common network node, and typically includes many or all of the elements described above relative to the personal computer 920. The logical connections depicted in FIG. 9 include a local area network (LAN) 951 and a wide area network (WAN) 952. Such networking environments are commonplace in offices, enterprise-wide computer networks, intranets, and the Internet.

When used in a LAN networking environment, the personal computer 920 is connected to the local network 951 through a network interface or adapter 953. When used in a WAN networking environment, the personal computer 920 typically includes a modem 954 or other means for establishing communications over the WAN 952. The modem 954, which may be internal or external, is connected to the system bus 923 via the serial port interface 946. In a networked environment, program modules depicted relative to the personal computer 920, or other portions thereof, may be stored in the remote storage device. It will be appreciated that the network connections shown are exemplary and other means of establishing a communications link between the computers may be used.

CONCLUSION

Embodiments of the present invention provide a method for generating write and read commands used to test hardware device models within a simulation environment. The embodiments keep track of the expected state of the device model by storing data associated with each write command in a "node," where a node is created for each data block for which a write command is generated. Each node includes a field that enables the method to keep track of whether a location associated with the node has valid data stored within it, and whether the data in the location has been verified since the most recent write. This enables the method to generate multiple write commands to any location without having to generate intervening read commands to validate the data. In addition, the embodiments enable read commands to be generated in a different sequence from the sequence of generated write commands. Embodiments of the invention also enable read commands to be more varied and flexible (e.g., allowing read commands that specify different data sizes and different masks from the data sizes and masks specified in previously generated write commands). Moreover, in connection with variable and flexible read commands, embodiments of the invention enable a test command generation method that maximizes the amount of data that is newly verified and minimizes the amount of unnecessary reads (re-verification). Further, embodiments of the invention enable more test permutations to be performed for better test coverage, without requiring unreasonably lengthy command lists. Further, embodiments of the invention include test command generation methods that require less overhead (e.g., less memory) to execute. Accordingly, the embodiments of the invention enable commands for more random, robust, and concise tests to be generated.

Modifications that would be apparent to those of skill in the art could be made to the methods of the various embodiments to achieve the same results. In particular, the sequence of execution of the various blocks could be modified, and/or the processing associated with various blocks could be performed in parallel, in some cases.

In addition, while embodiments of the invention have been described as writing bytes of data to nodes that correlate to 64-byte blocks, data could alternatively be written as bits, words, long words, or other sizes. In addition, the size of the block that each node is associated with can be larger or smaller than 64 bytes.

In addition, the various fields of each node (e.g., address, data, data valid, data verified) could be arranged in a different order from that which has been illustrated, and other fields could be associated with each node, in other embodiments. Also, although the data valid bitfield and the data verified bitfield use a single bit to indicate the state of the data in each location, indicators other than bits could be used to indicate the data state. For example, a data valid or data verified indicator for a location could be as long as multiple bits, a byte, a word, or some other size. Finally, the nodes and their various fields do not necessarily have to be stored in contiguous locations, as they could be stored in parts throughout a storage medium.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method to test a hardware device model comprising: using a processor for:
   forming a first mask comprising a bit pattern in a first computer memory location;
   writing data to a location in a node, the node comprising an address in the computer memory, a plurality of data locations, a data valid field associated with each data location, and a data verified field associated with each data location;
   marking valid data items as a function of the data written to the node data locations by setting a bit value in the data valid field;
   reading a portion of said written data;
   marking verified data items as a function of the data read from the node data locations by setting a bit value in the data verified field;
   identifying valid data items that have not been verified by examining the bit value in the data valid field and the bit value in the data verified field, thereby quantifying an amount of newly verifiable data items; and
   storing the quantification of the amount of newly verifiable data items in a storage location;
   wherein the first mask is used to determine which locations to write to or read from; and
   wherein the locations are determined by:
      determining numeric bit positions of the bit pattern in the first mask that have value set;
      adding said address to the numeric bit positions of the bit pattern in the first mask that have value set.

2. The method of claim 1, further comprising forming a read command.

3. The method of claim 2, further comprising providing a second mask; wherein the second mask is used to determine bits of data to be written to the location in a node or bits of data to be read from the location in a node.

4. The method of claim 1, wherein said first mask is formed as a function of the data written to said data valid field.

5. The method of claim 1, wherein said quantifying an amount of newly verifiable items comprises logically ANDing said first mask with said valid items that have not been verified.

6. The method of claim 3, further comprising determining that said second mask is a useable mask by determining that said second mask is a sub-mask of said first mask.

7. The method of claim 6, further comprising determining said sub-mask by logically ANDing said first mask and said second mask, and if a result of said logical ANDing is equal to the second mask, then said second mask is a sub-mask.

8. The method of claim 6, further comprising:
   if said useable mask is present, then selecting a new first location and forming a new first mask.

9. The method of claim 3, further comprising:
   copying said second mask into said first mask;
   initializing a second location representing a largest amount of newly verifiable items to zero; and
   saving said first mask into a third mask.

10. The method of claim 9, wherein said quantifying an amount of newly verifiable items comprises:
    comparing said first mask with said valid items that have not been verified; and
    determining an amount of newly verifiable items represented by said first mask.

11. The method of claim 9, wherein said read command comprises:
    said location in a node;
    said third mask; and
    selected data, said selected data defined by said location in a node, said third mask, and a user supplied constraint of data size.

12. The method of claim 2, further comprising using said read command to verify data in a hardware simulation model.

13. A method comprising:
    using a processor for:
       forming a first mask comprising a bit pattern in a first location in a computer memory;
       providing a second mask in the computer memory comprising a bit pattern;
       determining to use said first mask or said second mask by examining a user-supplied constraint that indicates that an attempt must be made to use the second mask;
       if said second mask is to be used, then determining that said second mask is useable by determining that said second mask is a sub-mask of said first mask;
       if said second mask is useable, copying said second mask into said first mask;
       if said second mask is the first useable second mask found, then initializing a second location in the computer memory representing a largest amount of newly verifiable data items to zero;
       if said second mask is not useable, then calculating an amount of newly verifiable data items using said first mask to extract an amount of newly verifiable data items from a node comprising an address in the computer memory, a plurality of data locations, a data valid field associated with each data location, and a data verified field associated with each data location;
       if said amount of newly verifiable data items is not greater than said second location in the computer memory representing a largest amount of newly verifiable items; then selecting a new first location in the computer memory and forming a new first mask from said second mask;

if said amount of newly verifiable items is greater than said second location in the computer memory representing a largest amount of newly verifiable items, then saving said amount of newly verifiable data items in said second location in the computer memory representing a largest amount of newly verifiable data items;

saving said first mask into a third mask;

if not trying to use said second mask, then determining if said second location in the computer memory representing a largest amount of newly verifiable data items equals a maximum amount of newly verifiable data items;

and generating a read command to read said amount of newly verifiable data items in said second location.

14. The method of claim 13, wherein said second mask is formed by a user.

15. The method of claim 13, comprising determining that said second mask is useable by determining that said second mask comprises a sub-mask of said first mask.

16. The method of claim 15, wherein determining that said second mask comprises a sub-mask of said first mask comprises logically ANDing said first mask and said second mask, and if a result of said logical ANDing is equal to the second mask, then said second mask is a sub-mask.

17. The method of claim 13, wherein said amount of newly verifiable items using said first mask is calculated by:
determining valid items that have not been verified;
comparing said first mask with said valid items that have not been verified; and
determining the amount of newly verifiable items represented by said first mask.

18. The method of claim 13, wherein selecting a new location comprises incrementing an offset.

19. The method of claim 13, wherein said read command comprises:
said location in a node;
said third mask; and
selected data, said selected data defined by said location in a node, said third mask, and a user supplied constraint of data size.

20. The method of claim 13, wherein said first mask corresponds to valid items in a data field.

21. The method of claim 13, further comprising using said read command to verify data in a hardware simulation model.

22. A computer-readable medium holding computer-executable instructions, the computer-readable medium for performing a method to test a hardware device model in a computer system, the method comprising:
using a processor for:
forming a first mask comprising a bit pattern in a first computer memory location;
writing data to a location in a node, the node comprising an address in the computer memory, a plurality of data locations, a data valid field associated with each data location, and a data verified field associated with each data location;
marking valid data items as a function of the data written to the node data locations by setting a bit value in the data valid field;
reading a portion of said written data;
marking verified data items as a function of the data read from the node data locations by setting a bit value in the data verified field;
identifying valid data items that have not been verified by examining the bit value in the data valid field and the bit value in the data verified field, thereby quantifying an amount of newly verifiable data items; and
storing the quantification of the amount of newly verifiable data items in a storage location;
wherein the first mask is used to determine which locations to write to or read from; and
wherein the locations are determined by:
determining numeric bit positions of the bit pattern in the first mask that have value set;
adding said address to the numeric bit positions of the bit pattern in the first mask that have value set.

23. The computer readable medium of claim 22, wherein the computer readable medium further comprises instructions for forming a read command.

24. The computer readable medium of claim 23, wherein the computer readable medium further comprises instructions for providing a second mask; wherein the second mask is used to determine bits of data to be written to the location in a node or bits of data to be read from the location in a node.

25. The computer readable medium of claim 22, wherein said first mask is formed as a function of the data written to said data valid field.

26. The computer readable medium of claim 22, wherein said quantifying an amount of newly verifiable items comprises logically ANDing said first mask with said valid items that have not been verified.

27. The computer readable medium of claim 24, wherein the computer readable medium further comprises instructions for determining that said second mask is a useable mask by determining that said second mask is a sub-mask of said first mask.

28. The computer readable medium of claim 27, wherein the computer readable medium further comprises instructions for determining said sub-mask by logically ANDing said first mask and said second mask, and if a result of said logical ANDing is equal to the second mask, then said second mask is a sub-mask.

29. The computer readable medium of claim 27, wherein the computer readable medium further comprises instructions for:
if said useable mask is present, then
selecting a new first location and forming a new first mask.

30. The computer readable medium of claim 24, wherein the computer readable medium further comprises instructions for:
copying said second mask into said first mask;
initializing a second location representing a largest amount of newly verifiable items to zero; and
saving said first mask into a third mask.

31. The computer readable medium of claim 30, wherein said quantifying an amount of newly verifiable items comprises:
comparing said first mask with said valid items that have not been verified; and
determining an amount of newly verifiable items represented by said first mask.

32. The computer readable medium of claim 30, wherein said read command comprises:
said location in a node;
said third mask; and
selected data, said selected data defined by said location in a node, said third mask, and a user supplied constraint of data size.

33. The computer readable medium of claim 23, wherein the computer readable medium further comprises instructions for using said read command to verify data in a hardware simulation model.

34. A computer-readable medium holding computer-executable instructions, the computer-readable medium for performing a method in a computer system, the method comprising:
forming a first mask comprising a bit pattern in a first location in a computer memory;
providing a second mask comprising a bit pattern in a second location in the computer memory;
determining to use said first mask or said second mask by examining a user-supplied constraint that indicates that an attempt must be made to use the second mask;
if said second mask is to be used, then determining that said second mask is useable by determining that said second mask is a sub-mask of said first mask;
if said second mask is useable,
copying said second mask into said first mask;
if said second mask is the first useable second mask found, then initializing a second location in the computer memory representing a largest amount of newly verifiable data items to zero;
if said second mask is not useable, then calculating an amount of newly verifiable data items using said first mask to extract an amount of newly verifiable data items;
if said amount of newly verifiable data items is not greater than said second location representing a largest amount of newly verifiable data items; then selecting a new first location in the computer memory and forming a new first mask from said second mask;
if said amount of newly verifiable data items is greater than said second location in the computer memory representing a largest amount of newly verifiable data items, then saving said amount of newly verifiable data items in said second location in the computer memory representing a largest amount of newly verifiable data items;
saving said first mask into a third mask;
if not trying to use said second mask, then determining if said second location in the computer memory representing a largest amount of newly verifiable data items equals a maximum amount of newly verifiable data items;
and generating a read command to read said amount of newly verifiable data items in said second location in the computer memory.

35. The computer readable medium of claim 34, wherein said second mask is formed by a user.

36. The computer readable medium of claim 34, comprising instructions for determining that said second mask is useable by determining said second mask comprises a sub-mask of said first mask.

37. The computer readable medium of claim 36, comprising instructions for determining that said second mask comprises a sub-mask of said first mask by logically ANDing said first mask and said second mask, and if a result of said logical ANDing is equal to the second mask, then said second mask is a sub-mask.

38. The computer readable medium of claim 34, wherein said amount of newly verifiable items using said first mask is calculated by:
determining valid items that have not been verified;
comparing said first mask with said valid items that have not been verified; and
determining the amount of newly verifiable items represented by said first mask.

39. The computer readable medium of claim 34, wherein selecting a new location comprises incrementing an offset.

40. The computer readable medium of claim 34, wherein said read command comprises:
said location in a node;
said third mask; and
selected data, said selected data defined by said location in a node, said third mask, and a user supplied constraint of data size.

41. The computer readable medium of claim 34, wherein said first mask corresponds to valid items in a data field.

42. The computer readable medium of claim 34, wherein the computer readable medium further comprises instructions for using said read command to verify data in a hardware simulation model.

43. A computer system to test a hardware device model comprising:
a device capable of storing at least one test command that can be used to test a software model of a hardware device; and
a processor for creating the at least one test command by:
forming a first mask comprising a bit pattern in a first computer memory location;
writing data to a location in a node, the node comprising an address in the computer memory, a plurality of data locations, a data valid field associated with each data location, and a data verified field associated with each data location;
marking valid data items as a function of the data written to the node data locations by setting a bit value in the data valid field;
reading a portion of said written data;
marking verified data items as a function of the data read from the node data locations by setting a bit value in the data verified field;
identifying valid data items that have not been verified by examining the bit value in the data valid field and the bit value in the data verified field, thereby quantifying an amount of newly verifiable data items; and
storing the quantification of the amount of newly verifiable data items in a storage location;
wherein the first mask is used to determine which locations to write to or read from; and
wherein the locations are determined by:
determining numeric bit positions of the bit pattern in the first mask that have value set;
adding said address to the numeric bit positions of the bit pattern in the first mask that have value set.

44. The computer system of claim 43, wherein the computer system further comprises instructions for forming a read command.

45. The computer system of claim 44, wherein the computer system further comprises instructions for providing a second mask; wherein the second mask is used to determine bits of data to be written to the location in a node or the bits of data to be read from the location in a node.

46. The computer system of claim 43, wherein said first mask is formed as a function of the data written to said data valid field.

47. The computer system of claim 43, wherein said quantifying an amount of newly verifiable items comprises logically ANDing said first mask with said valid items that have not been verified.

48. The computer system of claim 45, wherein the computer system further comprises instructions for determining that said second mask is a useable mask by determining that said second mask is a sub-mask of said first mask.

49. The computer system of claim 48, wherein the computer system further comprises instructions for determining said sub-mask by logically ANDing said first mask and said second mask, and if a result of said logical ANDing is equal to the second mask, then said second mask is a sub-mask.

50. The computer system of claim 48, wherein the computer system further comprises instructions for:
   if said useable mask is present, then
   selecting a new first location and forming a new first mask.

51. The computer system of claim 45, wherein the computer system further comprises instructions for:
   copying said second mask into said first mask;
   initializing a second location representing a largest amount of newly verifiable items to zero; and
   saving said first mask into a third mask.

52. The computer system of claim 51, wherein said quantifying an amount of newly verifiable items comprises:
   comparing said first mask with said valid items that have not been verified; and
   determining an amount of newly verifiable items represented by said first mask.

53. The computer system of claim 51, wherein said read command comprises:
   said location in a node;
   said third mask; and
   selected data, said selected data defined by said location in a node, said third mask, and a user supplied constraint of data size.

54. The computer system of claim 44, wherein the computer system further comprises instructions for using said read command to verify data in a hardware simulation model.

55. A computer system comprising:
   a device capable of storing at least one test command that can be used to test a software model of a hardware device; and
   a processor for creating the at least one test command by:
      forming a first mask comprising a bit pattern in a first location in a computer memory;
      providing a second mask comprising a bit pattern in a second location in the computer memory;
      determining to use said first mask or said second mask by examining a user-supplied constraint that indicates that an attempt must be made to use the second mask;
   if said second mask is to be used, then determining that said second mask is useable by determining that said second mask is a sub-mask of said first mask;
   if said second mask is useable,
      copying said second mask into said first mask;
      setting a flag in the computer memory indicating a useable offset is found;
      if said second mask is the first useable second mask found, then initializing a second location in the computer memory representing a largest amount of newly verifiable data items to zero;
   if said second mask is not useable and said flag indicating a useable offset has not been set, then calculating an amount of newly verifiable data items using said first mask to extract an amount of newly verifiable data items;
   if said amount of newly verifiable data items is not greater than said second location in the computer memory representing a largest amount of newly verifiable data items; then selecting a new first location in the computer memory and forming a new first mask from said second mask;
   if said amount of newly verifiable data is greater than said second location in the computer memory representing a largest amount of newly verifiable data items, then saving said amount of newly verifiable data items in said second location in the computer memory representing a largest amount of newly verifiable data items;
      saving said first mask into a third mask;
      if not trying to use said second mask, or trying to use said second mask and said flag indicating a useable offset has been set, then determining if said second location in the computer memory representing a largest amount of newly verifiable data items equals a maximum amount of newly verifiable data items;
   and generating a read command to read said amount of newly verifiable data items in said second location in the computer memory.

56. The computer system of claim 55, wherein said second mask is formed by a user.

57. The computer system of claim 55, wherein determining that said second mask is useable comprises determining that said second mask comprises a sub-mask of said first mask.

58. The computer system of claim 57, wherein determining that said second mask comprises a sub-mask of said first mask comprises logically ANDing said first mask and said second mask, and if a result of said logical ANDing is equal to the second mask, then said second mask is a sub-mask.

59. The computer system of claim 55, wherein said amount of newly verifiable items using said first mask is calculated by:
   determining valid items that have not been verified;
   comparing said first mask with said valid items that have not been verified; and
   determining the amount of newly verifiable items represented by said first mask.

60. The computer system of claim 55, wherein selecting a new location comprises incrementing an offset.

61. The computer system of claim 55, wherein said read command comprises:
   said location in a node;
   said third mask; and
   selected data, said selected data defined by said location in a node, said third mask, and a user supplied constraint of data size.

62. The computer system of claim 55, wherein said first mask corresponds to valid items in a data field.

63. The computer system of claim 55, wherein the computer system further comprises instructions for using said read command to verify data in a hardware simulation model.

* * * * *

UNITED STATES PATENT AND TRADEMARK OFFICE
CERTIFICATE OF CORRECTION

PATENT NO. : 7,778,812 B2  Page 1 of 1
APPLICATION NO. : 11/031290
DATED : August 17, 2010
INVENTOR(S) : Robert Hoffman, Jr.

It is certified that error appears in the above-identified patent and that said Letters Patent is hereby corrected as shown below:

In the Claims:
In column 29, line 1, in Claim 33, delete "claim 23" and insert -- claim 22 --, therefor.

Signed and Sealed this

Nineteenth Day of October, 2010

David J. Kappos
*Director of the United States Patent and Trademark Office*